(12) United States Patent
Nakao

(10) Patent No.: US 10,994,938 B2
(45) Date of Patent: May 4, 2021

(54) VACUUM PROCESSING DEVICE

(71) Applicant: ULVAC, Inc., Chigasaki (JP)

(72) Inventor: Hirotoshi Nakao, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 396 days.

(21) Appl. No.: 16/004,906

(22) Filed: Jun. 11, 2018

(65) Prior Publication Data

US 2018/0370733 A1 Dec. 27, 2018

Related U.S. Application Data

(63) Continuation of application No. PCT/JP2016/087631, filed on Dec. 16, 2016.

(30) Foreign Application Priority Data

Dec. 17, 2015 (JP) .............................. JP2015-246779

(51) Int. Cl.
*B65G 17/12* (2006.01)
*C23C 14/34* (2006.01)
(Continued)

(52) U.S. Cl.
CPC ........... *B65G 17/12* (2013.01); *B65G 17/326* (2013.01); *B65G 49/061* (2013.01); *C23C 14/34* (2013.01);
(Continued)

(58) Field of Classification Search
CPC .... B65G 17/12; B65G 17/123; B65G 17/326; B65G 49/061; B65G 2201/022;
(Continued)

(56) References Cited

U.S. PATENT DOCUMENTS

| 4,261,808 | A | * | 4/1981 | Walker | ................. C23C 14/568 |
| | | | | | 204/298.25 |
| 2008/0251376 | A1 | * | 10/2008 | Takizawa | .............. C23C 14/541 |
| | | | | | 204/192.15 |
| 2013/0115373 | A1 | * | 5/2013 | Kim | ...................... C23C 16/458 |
| | | | | | 427/255.5 |

FOREIGN PATENT DOCUMENTS

| JP | S55-54569 A | 4/1980 |
| JP | S58-141386 A | 8/1983 |

(Continued)

OTHER PUBLICATIONS

International Search Report for International Application No. PCT/JP2016/087631 dated Mar. 21, 2017 (2 Sheets).

(Continued)

*Primary Examiner* — John J Brayton
(74) *Attorney, Agent, or Firm* — Kratz, Quintos & Hanson, LLP

(57) ABSTRACT

The present invention provides a technique to enable sufficient space saving in a transit-type vacuum processing device. The vacuum processing device 1 of the present invention has: a vacuum chamber 2 where a single vacuum ambience is formed; first and second processing regions 4 and 5 that are provided in the vacuum chamber 2 and have a processing source that performs processing on a planar process surface of a substrate 10; and a conveyance drive member 33 that forms a conveyance path for conveying the substrate 10 so as to pass through the first and second processing regions 4 and 5. The conveyance path is formed as a single annular path when the conveyance path is projected onto a plane (vertical plane) containing: a normal line of an arbitrary point on a process surface of the substrate 10 conveyed through the conveyance path, and a trajectory line drawn by the arbitrary point on the process surface of (Continued)

the substrate 10 when the substrate 10 passes straight through the first and second processing regions 4 and 5.

11 Claims, 27 Drawing Sheets

(51) Int. Cl.
*B65G 17/32* (2006.01)
*C23C 14/50* (2006.01)
*C23C 14/56* (2006.01)
*H01L 21/677* (2006.01)
*H01L 21/67* (2006.01)
*B65G 49/06* (2006.01)

(52) U.S. Cl.
CPC ............ *C23C 14/50* (2013.01); *C23C 14/568* (2013.01); *H01L 21/6776* (2013.01); *H01L 21/67109* (2013.01); *H01L 21/67706* (2013.01); *H01L 21/67715* (2013.01); *B65G 2201/022* (2013.01)

(58) Field of Classification Search
CPC ......... H01L 21/67109; H01L 21/67715; H01L 21/67706

USPC .................................................... 204/298.09
See application file for complete search history.

(56) References Cited

FOREIGN PATENT DOCUMENTS

| | | |
|---|---|---|
| JP | S60-039162 A | 2/1985 |
| JP | H08-096358 A | 4/1996 |
| JP | 2002-176090 A | 6/2002 |
| JP | 2002-288888 A | 10/2002 |
| JP | 2004-285426 A | 10/2004 |
| JP | 2007-031821 A | 2/2007 |
| JP | 2008-231575 A | 10/2008 |
| JP | 2013-080990 A | 5/2013 |
| JP | 2013-131542 A | 7/2013 |
| WO | 2008/050662 A1 | 5/2008 |

OTHER PUBLICATIONS

Written Opinion of the International Searching Authority on the International-Phase Application No. PCT/JP2016/87631 dated Jun. 28, 2018 (11 Sheets).

* cited by examiner

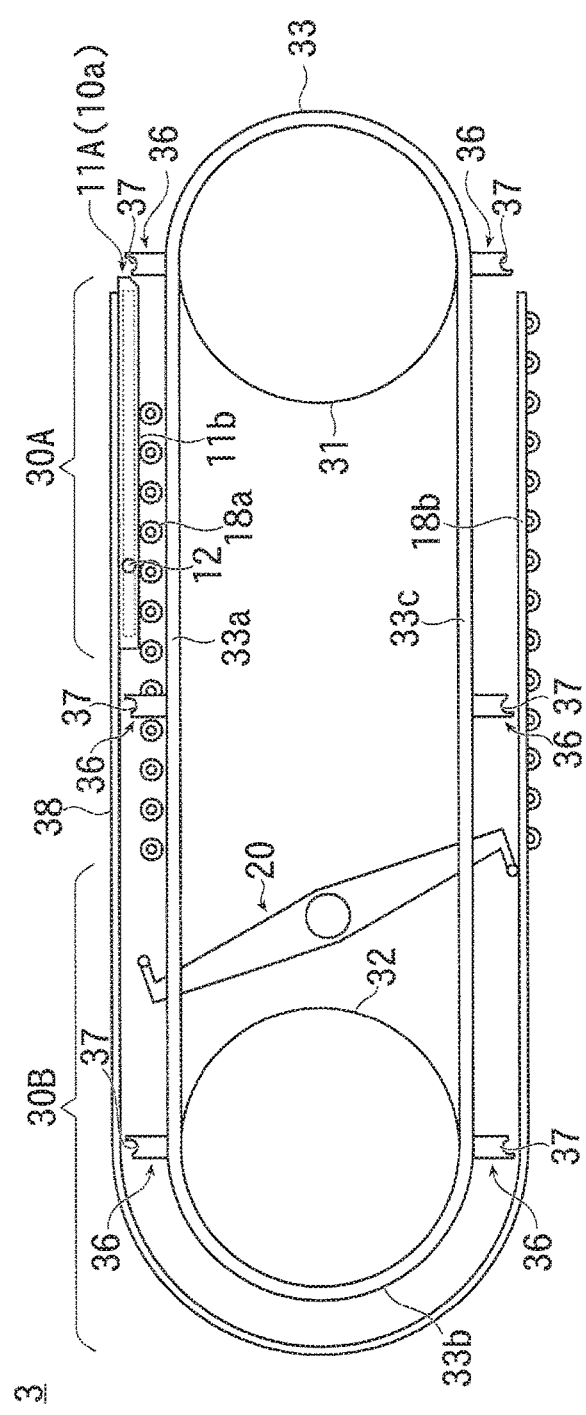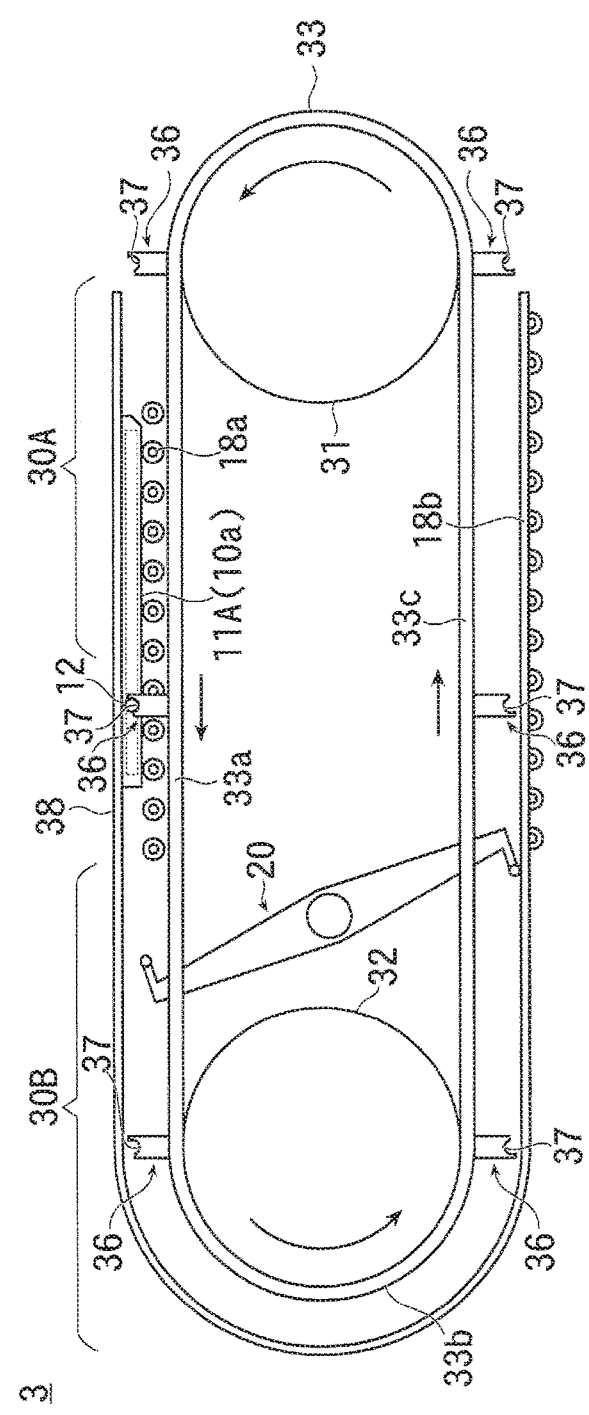
Fig. 9 (a)
Fig. 9 (b)

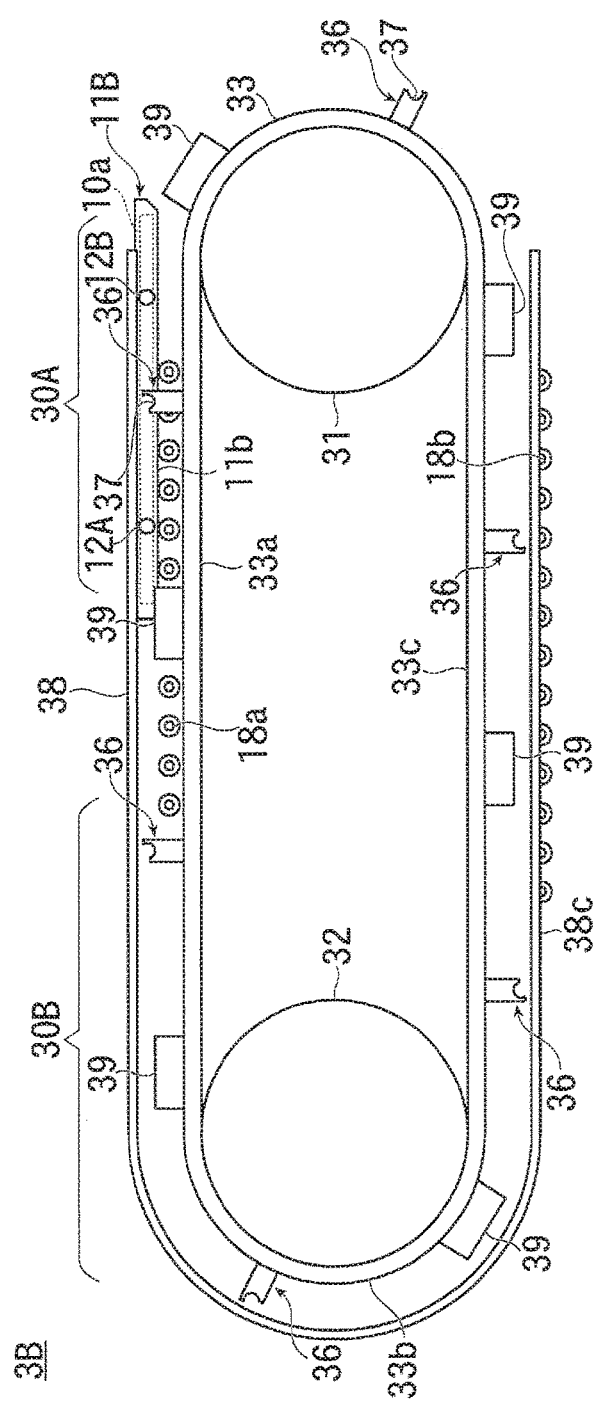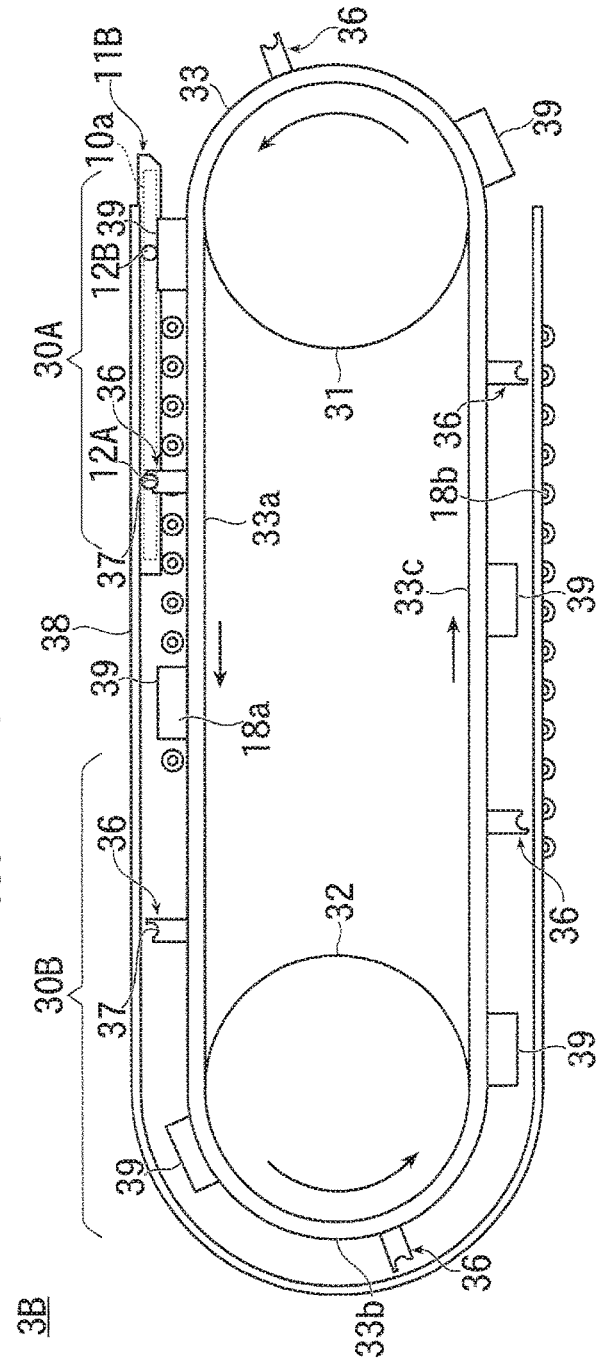
Fig. 19(a)
Fig. 19(b)

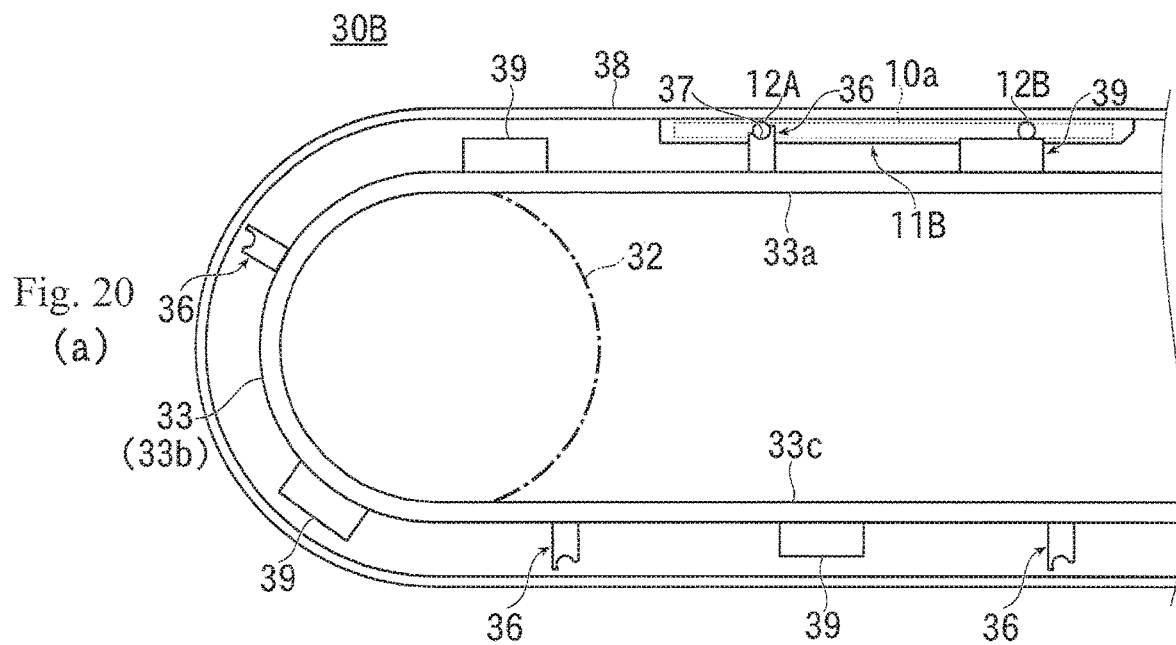
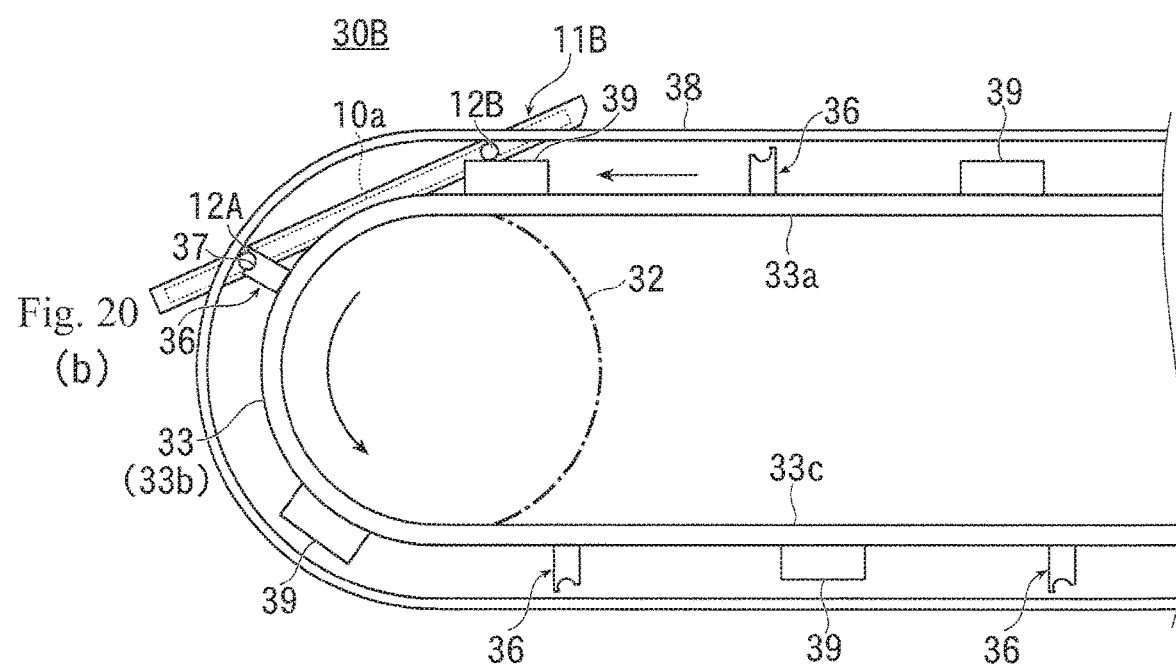

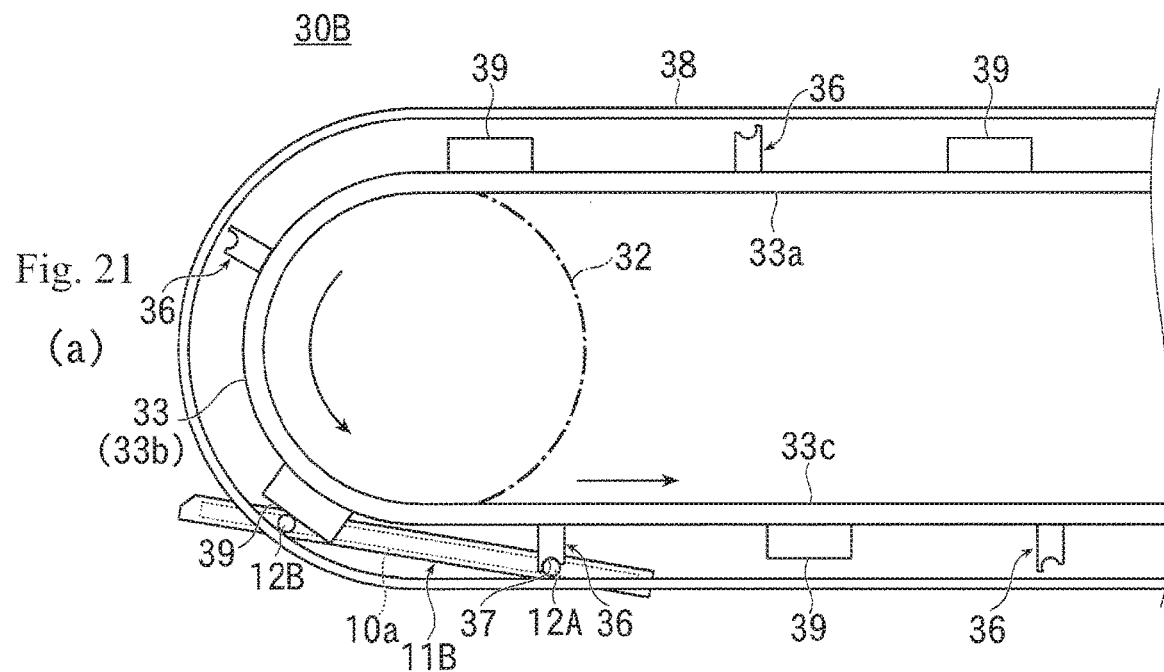
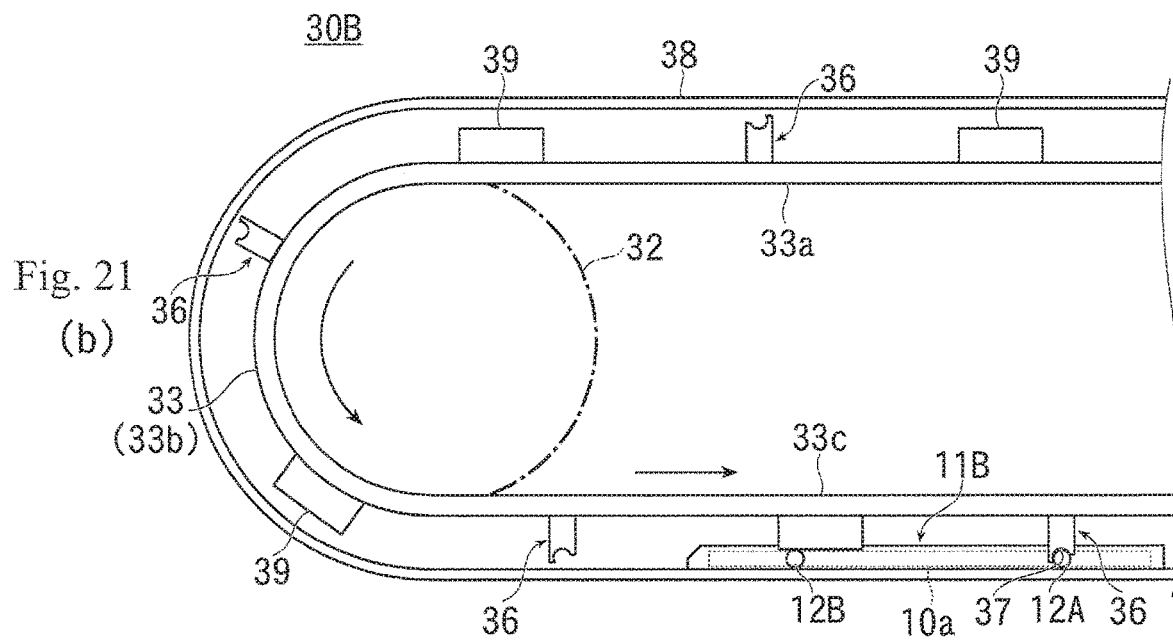
Fig. 21

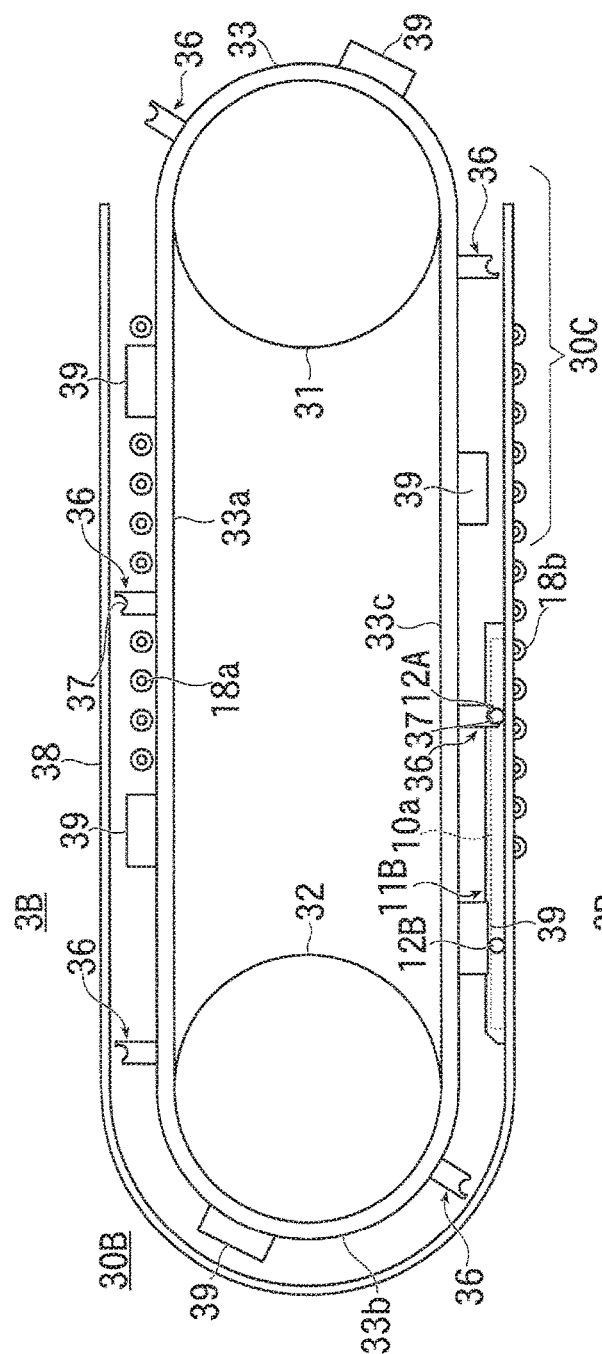
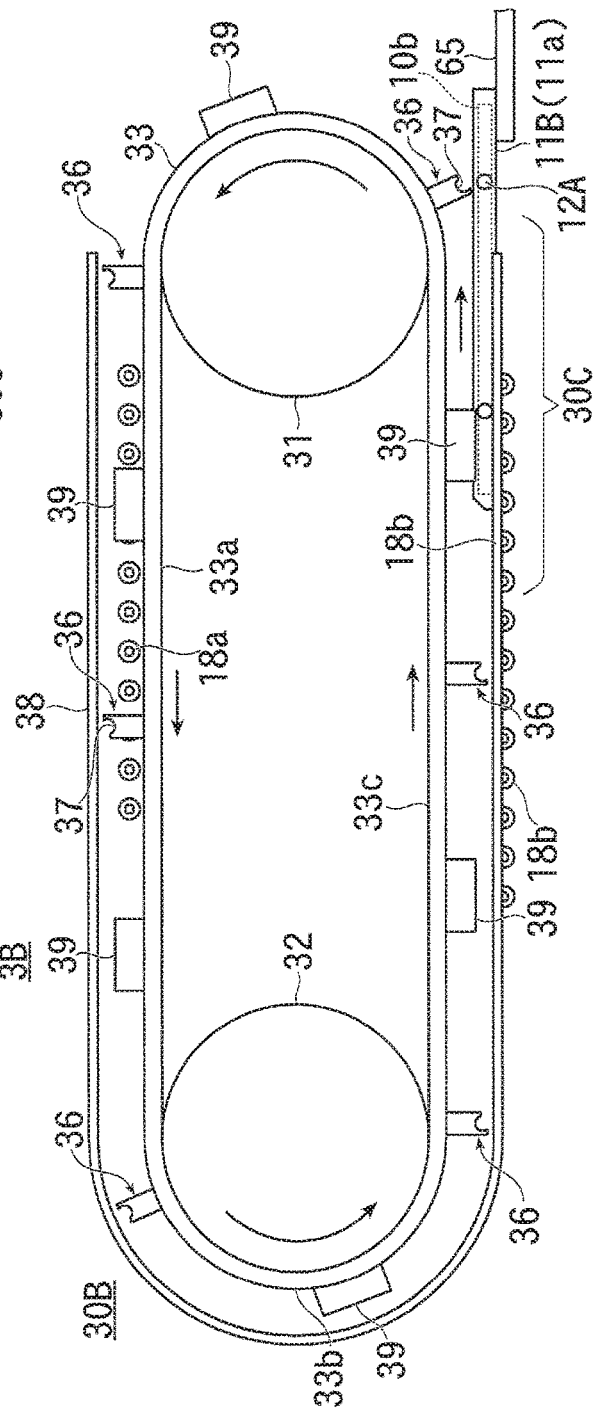
Fig. 22 (a)
Fig. 22 (b)

VACUUM PROCESSING DEVICE

This application is a continuation of International Application No. PCT/JP2016/087631, filed on Dec. 16, 2016, which claims priority to Japan Patent Application No. 2015-246779, filed on Dec. 17, 2015. The contents of the prior applications are herein incorporated by reference in their entireties.

TECHNICAL FIELD

The present invention generally relates to a technique for a vacuum processing device that performs vacuum processing (such as, film formation) on a substrate in vacuum, and, in particular, to a technique for a through-type vacuum processing device that performs processing while a substrate holder that holds a plurality of substrates is moved.

BACKGROUND ART

A conventionally known vacuum processing device performs processing (such as, film formation) during passage of a plurality of substrates to be processed that are mounted on a substrate holder (such as, a tray).

This type of vacuum processing device, one that has an annular conveyance path, is also known. Also, in the conventional art, in a step of transferring a substrate to be processed, the substrate to be processed is introduced into the conveyance path (loading), and the processed substrate is ejected from the conveyance path (unloading).

In the configuration of the conventional technique, the process surface of a substrate to be processed is kept horizontal between the loading and unloading positions. While the substrate to be processed travels through an annular conveyance path disposed within a horizontal plane, each process is performed thereon.

Consequently, in this type of conventional technique, not only the area of the surface of a substrate to be processed, but also the area of auxiliary equipment (such as, transfer equipment) is added to the horizontal area (when an annular path is formed within a surface in parallel with the process surface, the area of the path is included even if the path runs in the vertical direction).

In addition, in the configuration of this type of conventional technique, substrates in a matrix of a plurality of rows×columns are mounted on the tray. The areas of all the processing regions and auxiliary equipment need to be large enough to completely cover the surface area of the tray. Consequently, this problem is one of the major obstacles to reducing the installation space in addition to the aforementioned problem.

Consider, for example, a case where a plurality of trays configured to receive substrates to be processed in a single row are used, and these trays are mounted while directed in the conveyance direction. In a process that starts performing the processing on the substrate mounted at the front end of the tray and ends the processing upon completion of processing on the substrate mounted at the rear end of the tray, an extra processing region needs to be provided to cover the length of the area from the second substrate to the rear-end substrate when processing on the substrate at the front end of the tray begins. The aforementioned extra processing region also needs to cover the length of the area from the front-end substrate to the substrate before the rear-end substrate when processing on the substrate at the rear end of the tray is completed. The problem of this process is that sufficient space saving cannot be achieved.

CITATION LIST

Related Art Documents

Patent Document 1: Japanese Patent Application Laid-Open No. 2007-031821
Patent Document 2: Japanese Patent Application Laid-Open No. 2002-288888
Patent Document 3: Japanese Patent Application Laid-Open No. 2004-285426
Patent Document 4: Japanese Patent Application Laid-Open No. 2002-176090
Patent Document 5: WO2008/050662
Patent Document 6: Japanese Patent Application Laid-Open No. Hei. 08-096358
Patent Document 7: Japanese Patent Application Laid-Open No. 2013-131542

SUMMARY OF THE INVENTION

Problems to be Solved by the Invention

The present invention has been made to address the foregoing technical problems of the conventional techniques. An object of the present invention is to provide a technique to enable sufficient space saving in a through-type vacuum processing device.

Means for Solving the Problems

In the present invention made to achieve the above object, a vacuum processing device has: a vacuum chamber in which a single vacuum ambience is formed; a processing region that is provided in the vacuum chamber and has a processing source that performs processing on a planar process surface of a substrate; a conveyance path that is provided in the vacuum chamber and conveys the substrate so as to pass through the processing region; and a substrate holder conveyance mechanism configured to convey a substrate holder along the conveyance path. The substrate holder holds and aligns a plurality of substrates in an orthogonal conveyance direction orthogonal to a conveyance direction of the substrates. The conveyance path is formed as a single annular path when the conveyance path is projected onto a plane containing: a normal line of an arbitrary point on a process surface of the substrate conveyed through the conveyance path; and a trajectory line drawn by the arbitrary point on the process surface of the substrate when the substrate passes straight through the processing region. The substrate holder conveyance mechanism is provided with: a substrate holder introduction portion for passing, to the substrate holder conveyance mechanism, the substrate holder that holds a pre-process substrate; and a substrate holder ejection portion for removing, from the substrate holder conveyance mechanism, the substrate holder that holds a post-process substrate. At both end portions in the orthogonal conveyance direction, the substrate holder has a support shaft extending in the orthogonal conveyance direction. In the substrate holder conveyance mechanism, the substrate holder is configured such that the support shaft thereof is rotatably and removably held to a hold drive portion around a rotation axis line, as its center, running in the orthogonal conveyance direction, wherein the hold drive portion is provided to a drive member constituting the conveyance path. The hold drive portion is provided outside the drive member; and a guide member for preventing the hold drive portion from falling from the drive member is provided. The guide member is configured such that the substrate holder is held by the hold drive portion at the substrate holder introduction portion of the substrate holder conveyance mechanism; and the substrate holder is released from the hold drive portion at the substrate holder ejection portion of the substrate holder conveyance mechanism.

The present invention is also effective when the substrate holder conveyance mechanism has the processing region on each of an outward path and a return path of the conveyance path.

The present invention is also effective when the substrate holder conveyance mechanism has a conveying and turning portion for conveying the substrate holder by turning from the outward path to the return path of the conveyance path; and the conveying and turning portion is configured to convey the substrate holder without reversing front and rear sides of the substrate holder in the conveyance direction.

The present invention is also effective when the substrate holder conveyance mechanism has a conveying and turning portion for conveying the substrate holder by turning from the outward path to the return path of the conveyance path; and the conveying and turning portion is configured to convey the substrate holder by reversing the front and rear sides of the substrate holder in the conveyance direction.

The present invention is also effective when the substrate holder conveyance mechanism has a heating mechanism for heating the substrate holder that holds the substrate prior to processing.

The present invention is also effective when the substrate holder conveyance mechanism is integrally assembled to a frame structure body that can be removably attached to the vacuum chamber.

In the present invention, it is also effective to have a substrate carry-in and carry-out chamber as well as a substrate carry-in and carry-out mechanism and a conveyance robot in the vacuum chamber. The substrate carry-in and carry-out chamber is configured such that the ambience thereof is communicable with or separable from the ambience of the vacuum chamber and enables the substrate to be carried into and out of the vacuum chamber; the substrate carry-in and carry-out mechanism carries a substrate holder that holds a pre-process substrate from inside the substrate carry-in and carry-out chamber to the vacuum chamber and carries a substrate holder that holds a post-process substrate into the substrate carry-in and carry-out chamber; and the conveyance robot passes the substrate holder that holds the pre-process substrate from the substrate carry-in and carry-out mechanism to the substrate holder introduction portion of the substrate holder conveyance mechanism and removes the substrate holder that holds the post-process substrate from the substrate holder ejection portion of the substrate holder conveyance mechanism in order to pass the substrate holder to the substrate carry-in and carry-out mechanism.

The present invention is also effective when the substrate carry-in and carry-out mechanism has a substrate holder support portion that moves between a substrate holder passing position, where the substrate holder that holds a pre-process substrate is passed to the substrate holder introduction portion of the substrate holder conveyance mechanism, and a substrate holder removal position, where the substrate holder that holds a post-process substrate is removed from the substrate holder ejection portion of the substrate holder conveyance mechanism, and the conveyance robot is disposed on the substrate holder support portion.

The present invention is also effective when the substrate holder support portion of the substrate carry-in and carry-out mechanism is configured to be movable to a position where the vacuum chamber and the substrate carry-in and carry-out chamber communicate with each other, and to be moved to the aforementioned communication position, where the substrate holder support portion blocks a communication channel between the vacuum chamber and the substrate carry-in and carry-out chamber in order to thereby separate the ambience of the substrate carry-in and carry-out chamber from that of the vacuum chamber.

The present invention is also effective when a distance between the position where the vacuum chamber and the substrate carry-in and carry-out chamber communicate with each other and the substrate holder passing position is shorter than a distance between the position where the vacuum chamber and the substrate carry-in and carry-out chamber communicate with each other and the substrate holder removal position.

The present invention is also effective when the conveyance path projected onto a vertical plane is formed to be annular.

Advantageous Effects of the Invention

In the present invention, a conveyance path for conveying a substrate so that the substrate passes through a processing region is included in a vacuum chamber where a single vacuum ambience is produced. This conveyance path is formed as a single annular path when the conveyance path is projected onto a plane containing: a normal line of an arbitrary point on a planar process surface of the substrate conveyed through the conveyance path; and a trajectory line drawn by the arbitrary point on the process surface of the substrate when the substrate passes straight through the processing regions. Therefore, the present invention can significantly reduce a space occupied by the conveyance path compared with the conventional technique using a conveyance path formed to be annular when projected onto a plane in parallel with a planar process surface of the substrate. Thus, the present invention can, for example, achieve significant space saving in a vacuum processing device.

Also, in the present invention, a substrate holder conveyance mechanism configured to convey substrate holders, which hold and align a plurality of substrates, along the conveyance path (in particular, a substrate holder conveyance mechanism configured to convey a plurality of the substrate holders, which hold and align a plurality of substrates in the orthogonal conveyance direction orthogonal to the substrate conveyance direction, along the conveyance path) is included. In comparison with a case where processing is performed while a substrate holder that holds and align a plurality of the substrates in the substrate conveyance direction is conveyed, the length of the substrate holder and its associated redundant space can be reduced, whereby additional space saving can be achieved.

BRIEF DESCRIPTION OF DRAWINGS

FIG. 5(a) is a plan view thereof; and FIG. 5(b) is a cross-sectional view taken along line A-A of FIG. 5(a).

FIGS. 9(a) and 9(b) are explanatory views of operation of the substrate holder conveyance mechanism of the first example (part 1).

FIGS. 19(a) and 19(b) are explanatory views of an operation of the substrate holder conveyance mechanism of the second example (part 1).

FIGS. 20(a) and 20(b) are explanatory views of an operation of the conveying and turning portion of the substrate holder conveyance mechanism of the second example (part 1).

FIGS. 21(a) and 21(b) are explanatory views of the operation of the conveying and turning portion of the substrate holder conveyance mechanism of the second example (part 2).

FIGS. 22(a) and 22(b) are explanatory views of the operation of the substrate holder conveyance mechanism of the second example (part 2).

FIG. 25(a) is a plan view thereof; and FIG. 25(b) is a front view thereof.

FIG. 26(a) is a plan view of a substrate holder introduction mechanism of the conveyance robot; and FIG. 26(b) is a front view of the conveyance robot.

FIG. 27(a) is a plan view of a substrate holder ejection mechanism of the conveyance robot; and FIG. 27(b) is a front view of the conveyance robot.

DESCRIPTION OF EMBODIMENTS

Embodiments of the present invention will be hereinbelow described in detail with reference to the drawings.

Figure 1:
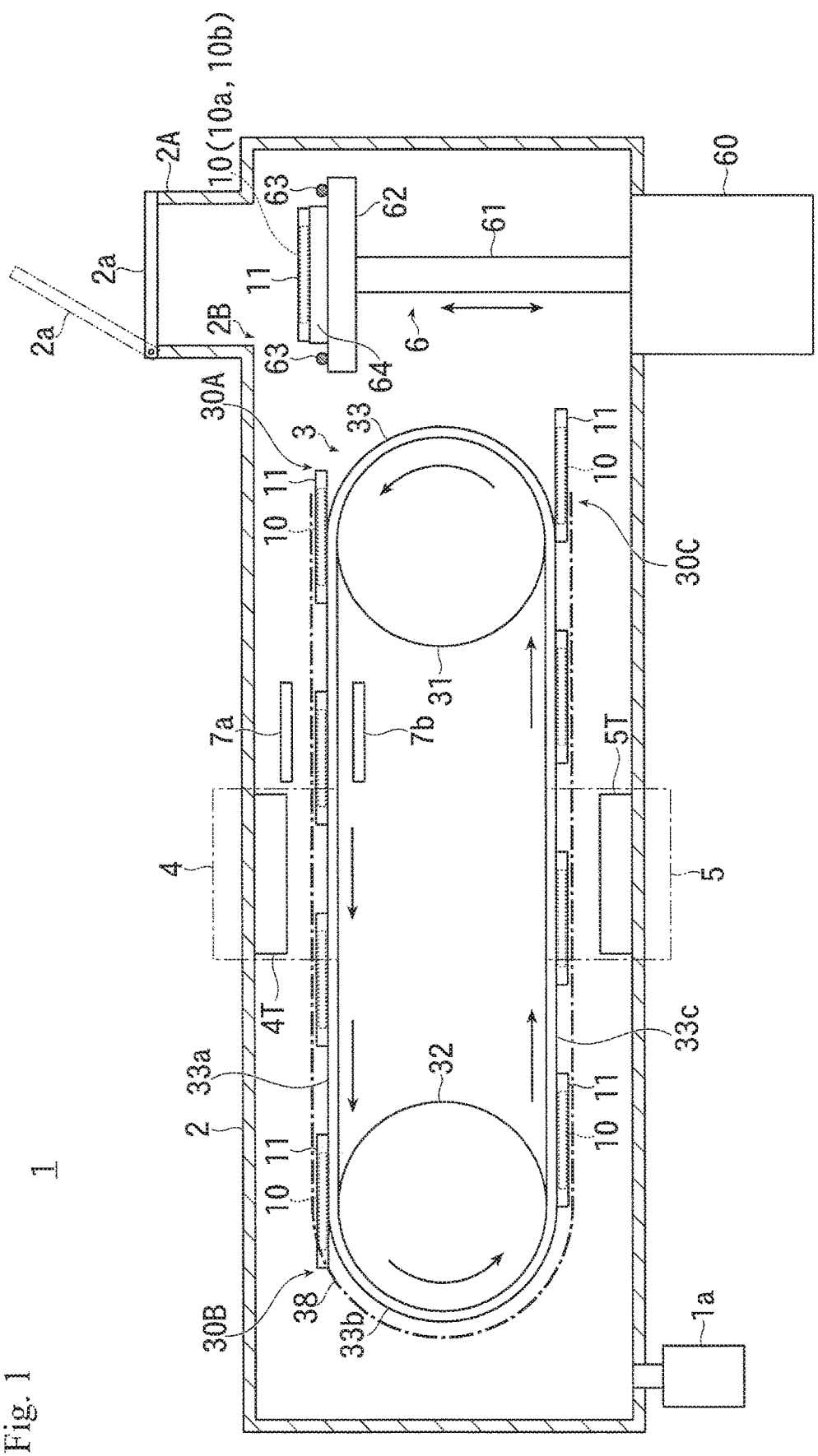
FIG. 1 is a schematic view illustrating an entire configuration of an embodiment of a vacuum processing device according to the present invention.

FIG. 1 is a schematic view illustrating an entire configuration of an embodiment of a vacuum processing device according to the present invention.

As illustrated in FIG. 1, a vacuum processing device 1 of this embodiment has a vacuum chamber 2 that is connected to a vacuum exhaust device 1a and where a single vacuum ambience is formed.

In the inside of the vacuum chamber 2, a substrate holder conveyance mechanism 3 that conveys a substrate holder 11 to be described later along the conveyance path is provided.

This substrate holder conveyance mechanism 3 is configured so as to continuously convey a plurality of the substrate holders 11 that hold a substrate 10 by (for example, a tray, or the like).

The substrate holder conveyance mechanism 3 used herein has first and second drive wheels 31 and 32, which are circular, and are constituted by, for example, sprocket, or the like, of which a detailed structure will be described later. These first and second drive wheels 31 and 32 are arranged at a predetermined distance so that the respective rotation axis lines are parallel with each other.

In turn, a single conveyance drive member 33 constituted by, for example, a chain, or the like is placed over the first and second drive wheels 31 and 32, whereby a single annular conveyance path is formed with respect to a vertical plane, as described hereinbelow.

In a configuration of this embodiment, a rotation drive force is transmitted from a drive mechanism that is not illustrated in the drawings to the first and second drive wheels 31 and 32 so as to operate the first and second drive wheels 31 and 32.

At the upper portion of the conveyance drive member 33 constituting the conveyance path, an outward path-side conveyance portion 33a is formed that moves from the first drive wheel 31 to the second drive wheel 32 in order to convey the substrate holder 11. A turning portion 33b is also formed that reverses the conveyance direction of the substrate holder 11 to the opposite direction by a portion of the conveyance drive member 33 at the periphery of the second drive wheel 32. Moreover, at the lower portion of the conveyance drive member 33, a return path-side conveyance portion 33c is formed that moves from the second drive wheel 32 to the first drive wheel 31.

Also, on the outer side of the conveyance drive member 33 of the substrate holder conveyance mechanism 3, a guide member 38 that prevents the conveyed substrate holder 11 from falling is provided.

This guide member 38 is formed as a single rail. Also, in parallel with the conveyance drive member 33, the guide member 38 is formed to extend from a substrate holder introduction portion 30A at the upper portion of the first drive wheel 31 via a conveyance turning portion 30B to a substrate holder ejection portion 30C at the lower portion of the first drive wheel 31.

In the vacuum chamber 2, first and second processing regions 4 and 5 are provided.

According to this embodiment, the first and second processing regions 4 and 5 are provided while the substrate holder conveyance mechanism 3 is interposed therebetween. The first processing region 4 has, for example, a sputtering target (processing source) 4T provided at the upper portion in the inside of the vacuum chamber 2, and the second processing region 5 has, for example, a sputtering target (processing source) 5T provided at the lower portion of the vacuum chamber 2.

The outward path-side conveyance portion 33a of the conveyance drive member 33 is configured to pass horizontally straight through the first processing region 4. The return path-side conveyance portion 33c is configured to pass horizontally straight through the second processing region 5.

Also, when the substrate holder 11 passes through the outward path-side conveyance portion 33a and the return path-side conveyance portion 33c of the conveyance drive member 33 that constitute the conveyance path, a planar process surface of the substrate 10 held by the substrate holder 11 is conveyed horizontally.

In the configuration described above, the conveyance path of this embodiment is formed as a single annular path when the conveyance path is projected onto a plane (vertical plane in this embodiment) containing a normal line of an arbitrary point on the planar process surface of the substrate 10 conveyed through the conveyance path, and a trajectory line drawn by the arbitrary point on the process surface of the substrate 10 when the substrate 10 passes straight through the first and second processing regions 4 and 5.

As described below, the substrate holder conveyance mechanism 3 of this embodiment includes one having a configuration of continuously performing processing (such as, film formation) on one surface of the substrate 10 using the first and second processing regions 4 and 5 and one having a configuration of separately performing processing (such as, film formation) on both surfaces of the substrate 10 using the same.

At a position near the substrate holder conveyance mechanism 3 in the vacuum chamber 2, for example, a position near the first drive wheel 31, a substrate carry-in and carry-out mechanism 6 is provided for passing the substrate holder 11 to the substrate holder conveyance mechanism 3 and receiving the substrate holder 11 from the substrate holder conveyance mechanism 3.

The substrate carry-in and carry-out mechanism 6 of this embodiment has a support portion (substrate holder support portion) 62 provided at the top (upper) end portion of a drive rod 61 driven, for example, upward and downward in the vertical direction by a lifting mechanism 60.

In this embodiment, a conveyance robot 64 is provided on the support portion 62 of the substrate carry-in and carry-out mechanism 6. This embodiment is configured such that the aforementioned substrate holder 11 is supported on this conveyance robot 64, and moved upward and downward in the vertical direction, and that by the conveyance robot 64, the substrate holder 11 is passed to and received from the substrate holder conveyance mechanism 3.

In this embodiment, as described below, the substrate holder 11 is passed from the substrate carry-in and carry-out mechanism 6 to the substrate holder introduction portion 30A of the outward path-side conveyance portion 33a of the substrate holder conveyance mechanism 3 (this position is hereinafter referred to as "substrate holder passing position"). Also, the substrate holder 11 is removed from the substrate holder ejection portion 30C of the return path-side conveyance portion 33c of the substrate holder conveyance mechanism 3 (this position is hereinafter referred to as "substrate holder removal position").

A substrate carry-in and carry-out chamber 2A is provided, for example, at the upper portion of the vacuum chamber 2 so as to carry the substrate 10 into and out of the vacuum chamber 2.

This substrate carry-in and carry-out chamber 2A is provided, for example, at a position above the aforementioned support portion 62 of the substrate carry-in and carry-out mechanism 6 via a communication channel 2B. An openable and closable lid portion 2a is provided, for example, above the substrate carry-in and carry-out chamber 2A.

As described below, a below-described pre-process substrate 10a carried into the substrate carry-in and carry-out chamber 2A is passed to and held by the substrate holder 11 on the conveyance robot 64 of the support portion 62 of the substrate carry-in and carry-out mechanism 6. Also, a below-described post-process substrate 10b is carried out to, for example, the air outside of the vacuum chamber 2 from the substrate holder 11 on the conveyance robot 64 of the support portion 62 of the substrate carry-in and carry-out mechanism 6.

In this embodiment, at the upper edge portion of the support portion 62 of the substrate carry-in and carry-out mechanism 6, a seal member 63 (for example, an O-ring, or the like) is provided so as to separate the ambience inside the vacuum chamber 2 from that of the substrate carry-in and carry-out chamber 2A for carrying in and out the substrate 10.

In this case, the support portion 62 of the substrate carry-in and carry-out mechanism 6 is lifted toward the substrate carry-in and carry-out chamber 2A, and the seal member 63 on the support portion 62 is tightly attached to the inner wall of the vacuum chamber 2 to block the communication channel 2B, whereby the ambience inside the substrate carry-in and carry-out chamber 2A is separated from the ambience inside the vacuum chamber 2.

In this embodiment with the aforementioned configuration, the distance between the position where the vacuum chamber 2 and the substrate carry-in and carry-out chamber 2A communicate with each other (communication channel 2B) and the substrate holder passing position (substrate holder introduction portion 30A) is shorter than the distance between the position where the vacuum chamber 2 and the substrate carry-in and carry-out chamber 2A communicate with each other (communication channel 2B) and the substrate holder removal position (substrate holder ejection portion 30C).

Meanwhile, near the first processing region 4, a pair of heating and cooling mechanisms 7a and 7b is provided. Each of the heating and cooling mechanisms 7a and 7b has a heating function and a cooling function for heating and cooling the substrate 10 held by the substrate holder 11.

In the example illustrated in FIG. 1, the heating and cooling mechanisms 7a and 7b are disposed so that the conveyance path is interposed between the heating and cooling mechanisms 7a and 7b from above and below in the area between the first drive wheel 31 and the first processing region 4. A process surface of the pre-process substrate 10a to be processed by the first processing region 4 and an unprocessed surface on the opposite side thereto can both be heated or cooled by the heating and cooling mechanisms 7a and 7b.

In this case, the process surface or the unprocessed surface of the pre-process substrate 10a can be selectively cooled by the heating and cooling mechanism 7a or 7b.

Also, in an alternative configuration, an additional cooling mechanism (not illustrated in the drawings), which has the same cooling function as that of the heating and cooling mechanisms 7b, is provided below the first processing region 4 so as to cool the unprocessed surface of the substrate 10 that is being heated for processing.

Meanwhile, the aforementioned pair of heating and cooling mechanisms 7a and 7b may also be disposed such that the conveyance path is interposed between the heating and cooling mechanisms 7a and 7b from above and below in the area between the second drive wheel 32 and the first processing region 4.

It is also possible to configure that one or both of the process surface and the unprocessed surface of the post-process substrate 10b having been processed by the first processing region 4 are cooled by the heating and cooling mechanisms 7a and 7b.

Specific descriptions are omitted, but it is alternatively possible to configure that the heating and cooling mechanisms 7a and 7b with the aforementioned configuration are provided near the second processing region 5 (the upstream and downstream sides in the conveyance direction), and, as in the case described above, the process surface of the pre-process substrate 10a to be processed by the second processing region 5 and the unprocessed surface on the side opposite of the process surface side can both be heated or cooled. Also, it is alternatively possible to configure that the process surface or the unprocessed surface of the pre-process substrate 10a can be selectively cooled by the heating and cooling mechanism 7a or 7b, and that the unprocessed surface of the substrate 10 that is being heated for processing can be alternatively cooled by an additional cooling mechanism provided above the second processing region 5.

It is also possible to alternatively configure that one or both of the process surface and the unprocessed surface of the post-process substrate 10b having been processed by the second processing region 5 can be cooled.

Also, heating and cooling of the substrate 10 by the above-described heating and cooling mechanisms 7a and 7b can be, as described below, performed whenever the same processing is performed on the substrate 10 multiple times.

Figure 2:
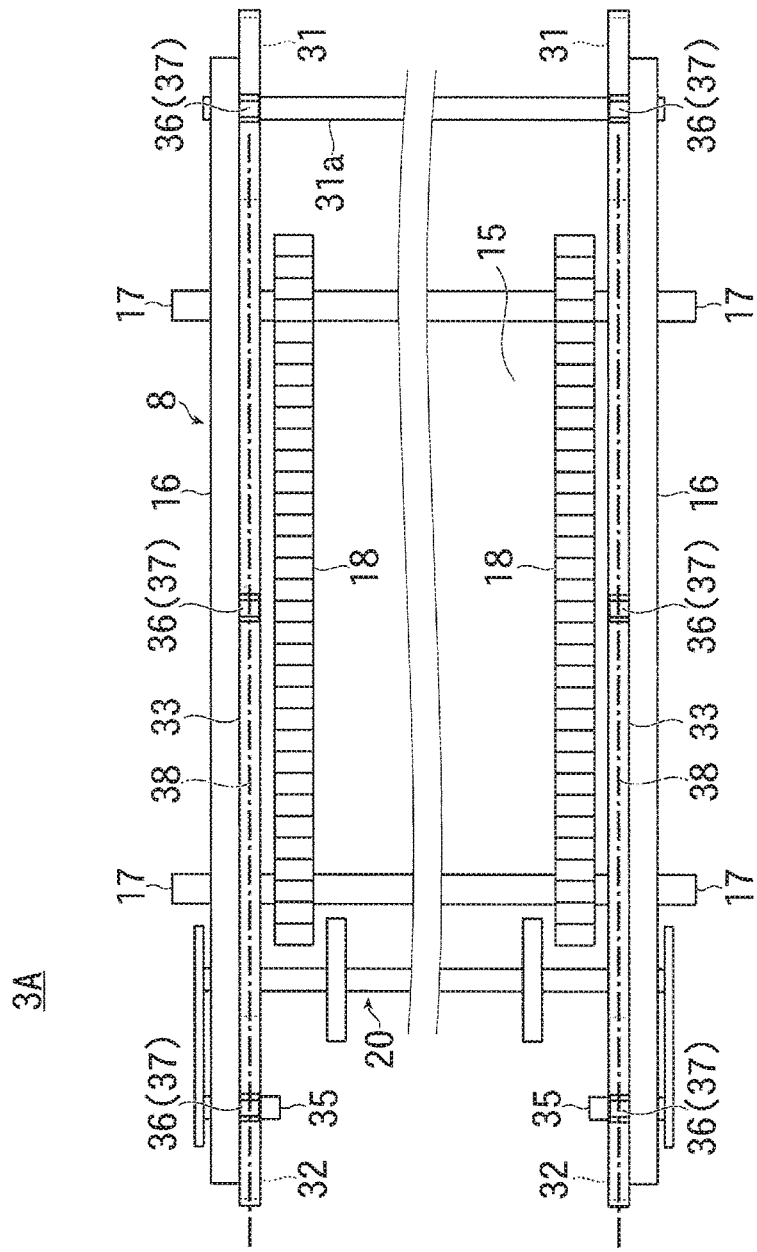
FIG. 2 is a plan view illustrating a schematic configuration of a first example of a substrate holder conveyance mechanism.
Figure 3:
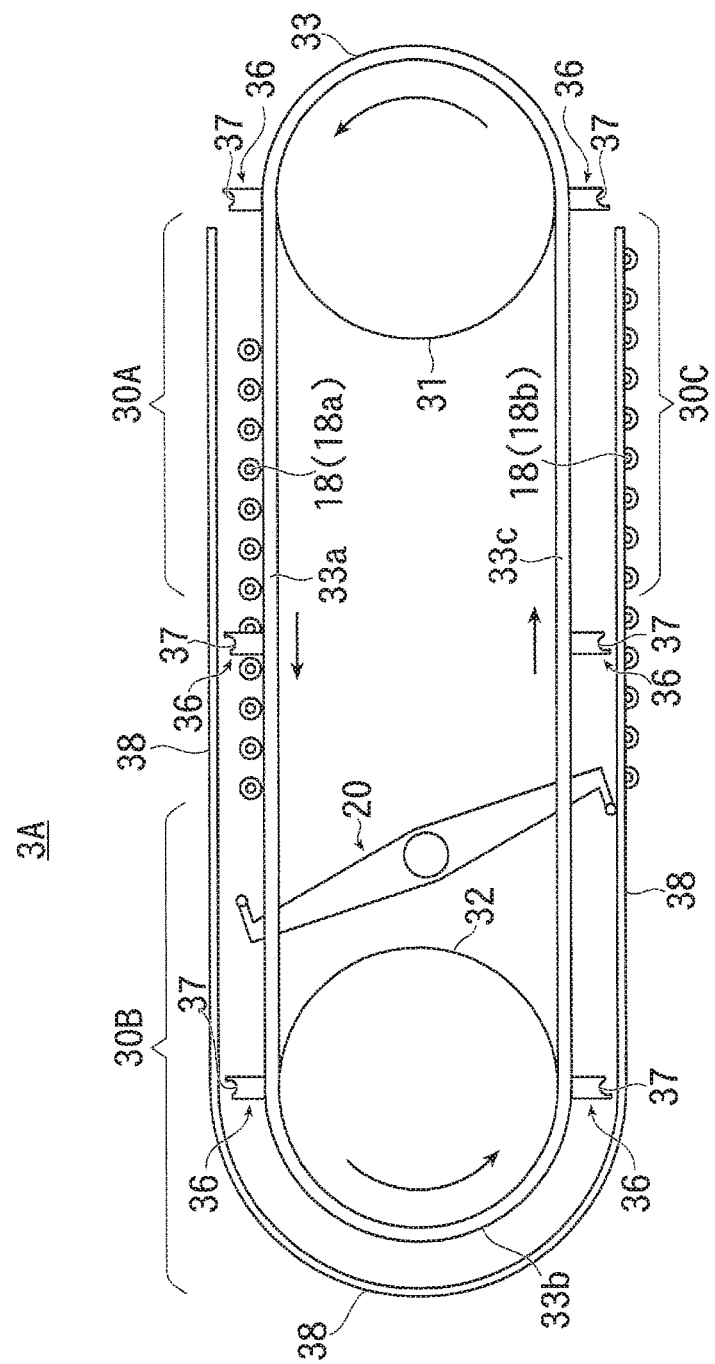
FIG. 3 is a front view illustrating main portions of the first example of the substrate holder conveyance mechanism.
Figure 4:
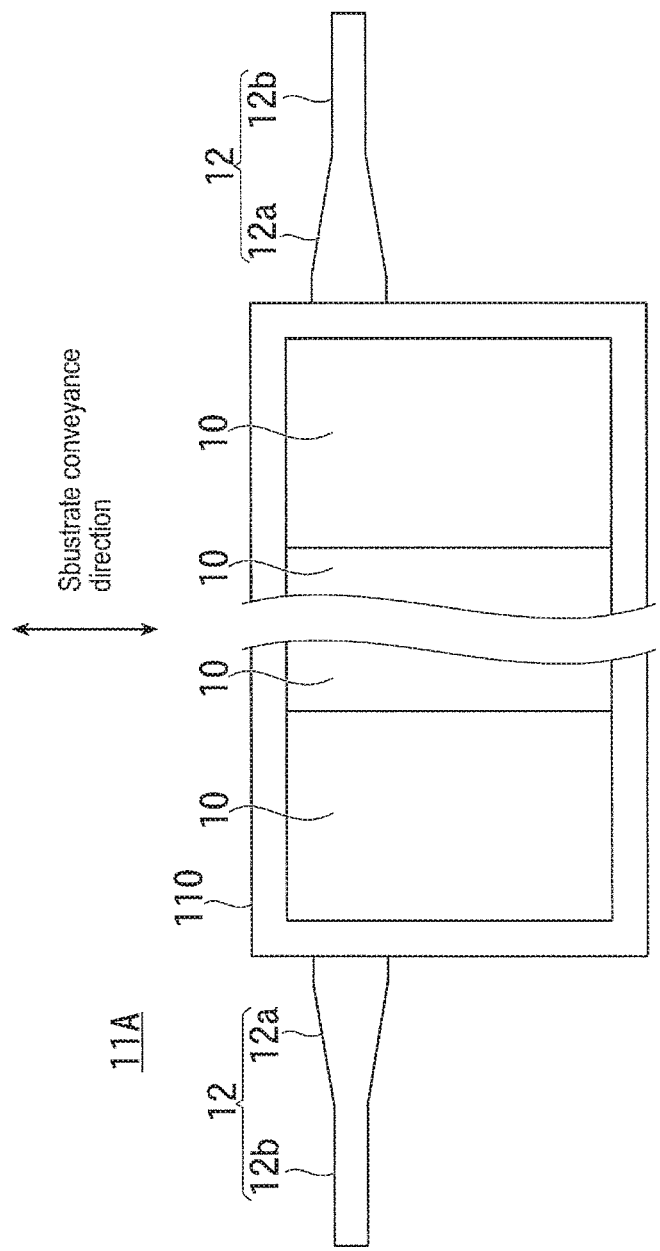
FIG. 4 is a plan view illustrating a configuration of a substrate holder used in this example.

FIG. 2 is a plan view illustrating a schematic configuration of a first example of a substrate holder conveyance mechanism. FIG. 3 is a front view illustrating main portions of the substrate holder conveyance mechanism. FIG. 4 is a plan view illustrating a configuration of a substrate holder used in this example.

Figure 5:
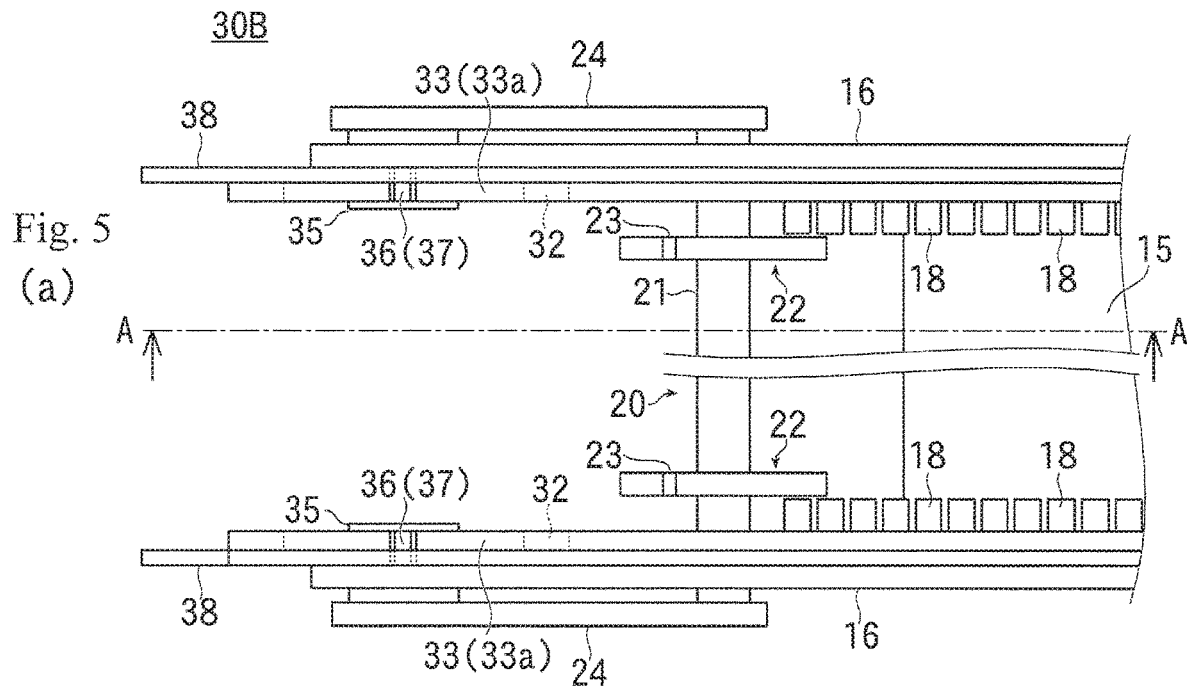
FIGS. 5(a) and 5(b) illustrate a configuration of a conveying and turning portion of the substrate holder conveyance mechanism of this example.
Figure 5:
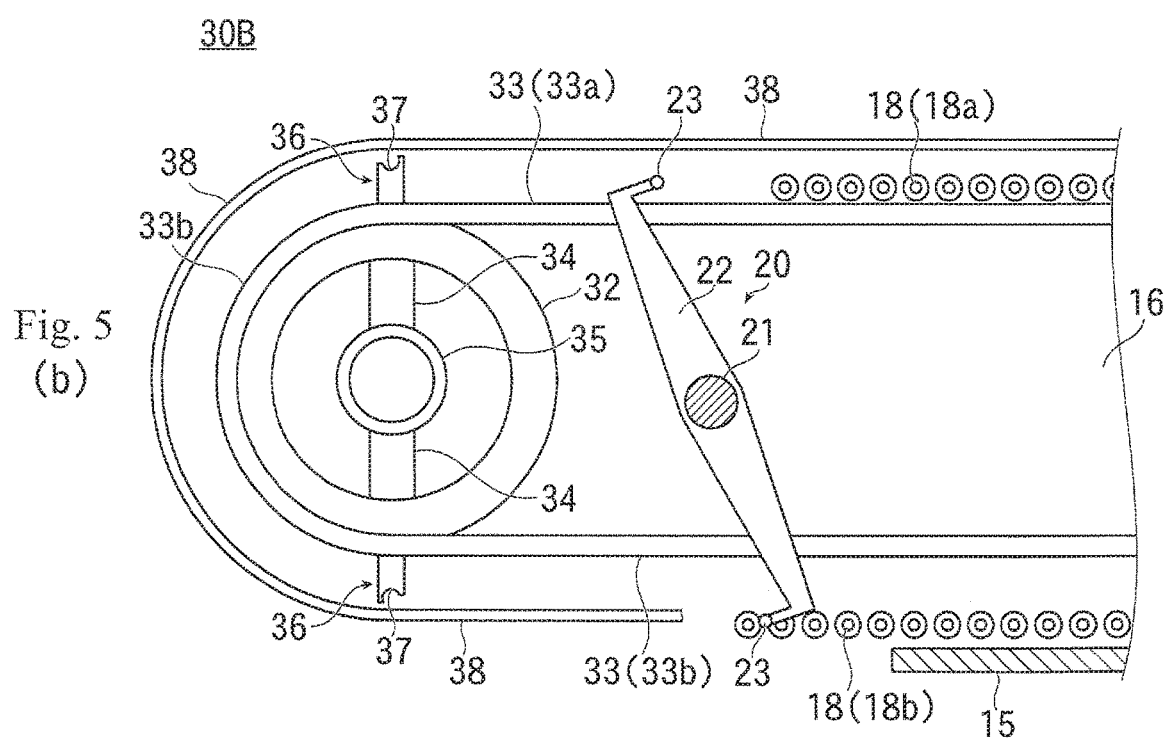

Also, FIGS. 5(a) and 5(b) illustrate a configuration of a conveying and turning portion of the substrate holder conveyance mechanism. FIG. 5(a) is a plan view thereof, and FIG. 5(b) is a cross-sectional view taken along line A-A of FIG. 5(a).

As illustrated in FIG. 2, in this example, a frame structure body 8 having a pair of flat-plate side frames 16 arranged in parallel with each other at a predetermined interval in the vertical direction is provided on a flat-plate base frame 15 provided in parallel with a horizontal plane. As discussed below, members that are assembled with the frame structure body 8 so as to be, for example, symmetrical with respect to the conveyance direction, and the substrate holder conveyance mechanism 3A of the first example is constituted as an integrated unit.

Also, this substrate holder conveyance mechanism 3A can be removably installed within the vacuum chamber 2 by an installation portion 17 provided to the frame structure body 8.

The substrate holder conveyance mechanism 3A of this example has a pair of the first and second drive wheels 31 and 32 with an identical diameter provided to each of the paired side frames 16.

The first drive wheels 31 have a drive shaft 31a that rotates as their centers around the rotation axis line in the direction orthogonal to the conveyance direction, so that the first drive wheels 31 rotate around the drive shaft 31a as their centers.

Meanwhile, the second drive wheels 32 have respective drive shafts 35 that are rotationally driven around the same rotation axis line as their centers and driven therearound orthogonal to the conveyance direction. Each drive shaft 35 is coupled with the second drive wheel 32 via a coupling member 34 (see FIG. 2 and FIGS. 5(a) and 5(b)).

Also, the aforementioned conveyance drive member 33 is placed over each of the first and second drive wheels 31 and 32 provided to the pair of side frames 16, respectively, whereby the conveyance path of FIG. 4 for conveying the substrate holder 11A shown in FIG. 4 is formed.

In addition, the substrate holder conveyance mechanism 3 of this embodiment is configured such that the outward path-side conveyance portion 33a located at the upper side of the conveyance drive member 33 and the return path-side conveyance portion 33c located at the lower side of the conveyance drive member 33 oppose each other and overlap each other in the vertical direction (see FIGS. 1 and 2).

A plurality of hold drive portions 36 are arranged at predetermined intervals on each of the paired conveyance drive members 33.

These hold drive portions 36 are directed to holding, conveying, and driving the substrate holder 11A and are installed on the conveyance drive member 33 so as to protrude toward the outer side of the conveyance drive member 33. As illustrated in FIG. 3, at its tip end portion, there is provided a holding recess portion 37 with, for example, a substantially J-hook shape (a shape where the height of the downstream side of the protrusion is lower than the height of the upstream side of the protrusion in the conveyance direction) that is formed to face, for example, the downstream side in the conveyance direction.

Also, as illustrated in FIG. 2, at a position inside the pair of conveyance drive members 33, a pair of substrate holder support mechanisms 18 that supports the conveyed substrate holder 11A is provided between the first and second drive wheels 31 and 32.

Each substrate holder support mechanism 18 includes rotatable members (for example, a plurality of rollers, or the like), and is provided near the conveyance drive member 33.

In this example, as illustrated in FIGS. 2 and 3, an outward path-side substrate holder support mechanism 18a is provided near the outward path-side conveyance portion 33a of the conveyance drive member 33, and a return path-side substrate holder support mechanism 18b is provided near the return path-side conveyance portion 33c of the conveyance drive member 33 so as to support both edge portions of the lower surface of the conveyed substrate holder 11A.

The outward path-side substrate holder support mechanism 18a is provided to extend in a straight line so that an end portion provided in the substrate holder introduction portion 30A is the starting end point and that the nearest position to the conveyance turning portion 30B is the terminal end portion with the first processing region 4 therebetween (see FIG. 1).

Meanwhile, the return path-side substrate holder support mechanism 18b extends in a straight line so that the position of the conveyance turning portion 30B on the side of the second drive wheel 32 is the starting end point and the position of the substrate holder ejection portion 30C is the terminal end portion with the second processing region 5 therebetween (see FIG. 1).

Also, at the periphery of the conveyance drive member 33 of the substrate holder conveyance mechanism 3, the guide member 38 that prevents the conveyed substrate holder 11A from falling is provided.

This guide member 38 is formed as a single rail. As illustrated in FIG. 3, the guide member 38 extends from the substrate holder introduction portion 30A near the first drive wheel 31 to the substrate holder ejection portion 30C near the first drive wheel 31 via the conveyance turning portion 30B near the second drive wheel 32.

As illustrated in FIG. 3, this guide member 38 is not provided in the section of the first drive wheel 31 on the side of the substrate carry-in and carry-out mechanism 6 illustrated in FIG. 1.

As illustrated in FIG. 4, the substrate holder 11A used in this example is configured to have a tray shape and, for example, holds and aligns a plurality of the substrates 10, for example, in a single row on a long-frame-shaped main body 110 in the longitudinal direction thereof.

This main body 110 of the substrate holder 11A is formed so that both surfaces of the substrate 10 are exposed, whereby processing (such as, film formation) is performed on both planar process surfaces of the substrate 10.

A support shaft 12 is provided at one end portion in the width direction, specifically, the conveyance direction on each of the two end portions of the main body 110 of the substrate holder 11A in the longitudinal direction thereof.

These support shafts 12 are each formed to have a circle in cross section around, as its center, the rotation axis line running in the longitudinal direction of the main body 110. A base portion 12a of each support shaft 12 is tapered toward both sides and formed in a truncated cone shape. A tip end portion 12b of each support shaft 12 is shaped as a cylinder with a smaller diameter than that of the base portion 12a.

Also, the tip end portion 12b of each support shaft 12 of the substrate holder 11A is engaged with the aforementioned holding recess portion 37 of the hold drive portion 36 of the conveyance drive member 33. The dimensions of each portion are determined so as to be rotatably held around this support shaft 12 as its center.

In this type of configuration, when the tip end portion 12b of each support shaft 12 of the substrate holder 11A is engaged with and held and conveyed by the holding recess portion 37 of the hold drive portion 36 of the conveyance drive member 33, the position of the substrate holder 11A in the support shaft 12 direction is determined by abutment between the holding recess portion 37 of the hold drive portion 36 and the aforementioned tapering support shaft 12.

Also, in this example, in a state where each tip end portion 12b of the support shaft 12 of the substrate holder 11A is engaged with and supported by the holding recess portion 37 of the hold drive portion 36 of the conveyance drive member 33, the dimensions of each member are determined so that a small gap is formed between the guide member 38 and the tip end portion 12b of the support shaft 12 of the substrate holder 11A.

Due to this configuration, when the tip end portion 12b of each support shaft 12 of the substrate holder 11A is engaged with and supported and conveyed by the holding recess portion 37 of the hold drive portion 36 of the conveyance drive member 33, abutment between the guide member 38 and the tip end portion 12b of the support shaft 12 of the substrate holder 11A prevents the substrate holder 11A from falling from the conveyance path.

The conveyance turning portion 30B of the substrate holder conveyance mechanism 3A of this example is configured as described below.

First, as illustrated in FIG. 3 and FIGS. 5(a) and 5(b), at a position in the substrate holder conveyance mechanism 3A that is near the second drive wheel 32 on the side of the first drive wheel 31, a posture control mechanism 20 is provided. The posture control mechanism 20 supports the substrate holder 11A and controls the posture thereof when the substrate 10 is turned and conveyed.

This posture control mechanism 20 has a drive shaft 21 that runs in a direction orthogonal to the conveyance direction, and this drive shaft 21 penetrates through the pair of side frames 16 and is rotatably held.

Also, to this drive shaft 21, a pair of support arms 22 is attached at an interval smaller than that for the pair of substrate holder support mechanisms 18 (see FIG. 5(a)).

These support arms 22 are formed of a member in the shape of a straight rod, and has both end portions to each of which a support roller 23 is provided (see FIG. 5(b)).

Meanwhile, the drive shaft 21 of the support arm 22 is configured to be coupled with the drive shaft 35 of the second drive wheel 32 by, for example, a belt-shaped power transmission member 24, whereby the second drive wheel 32 and the support arm 22 are, as described below, synchronously rotated in the same direction in a predetermined relationship.

A description will now be given of the operation of the vacuum processing device 1 of this embodiment that has the substrate holder conveyance mechanism 3A of the first example.

In this example, for ease of understanding, a case where the substrate 10 is held by one substrate holder 11A to perform processing will be described as an example.

Also, in this example, operation for introducing the substrate holder 11A into the substrate holder introduction portion 30A is performed while defining the side where the support shaft 12 of the substrate holder 11A is provided as the front side (see FIG. 4).

Figure 6:
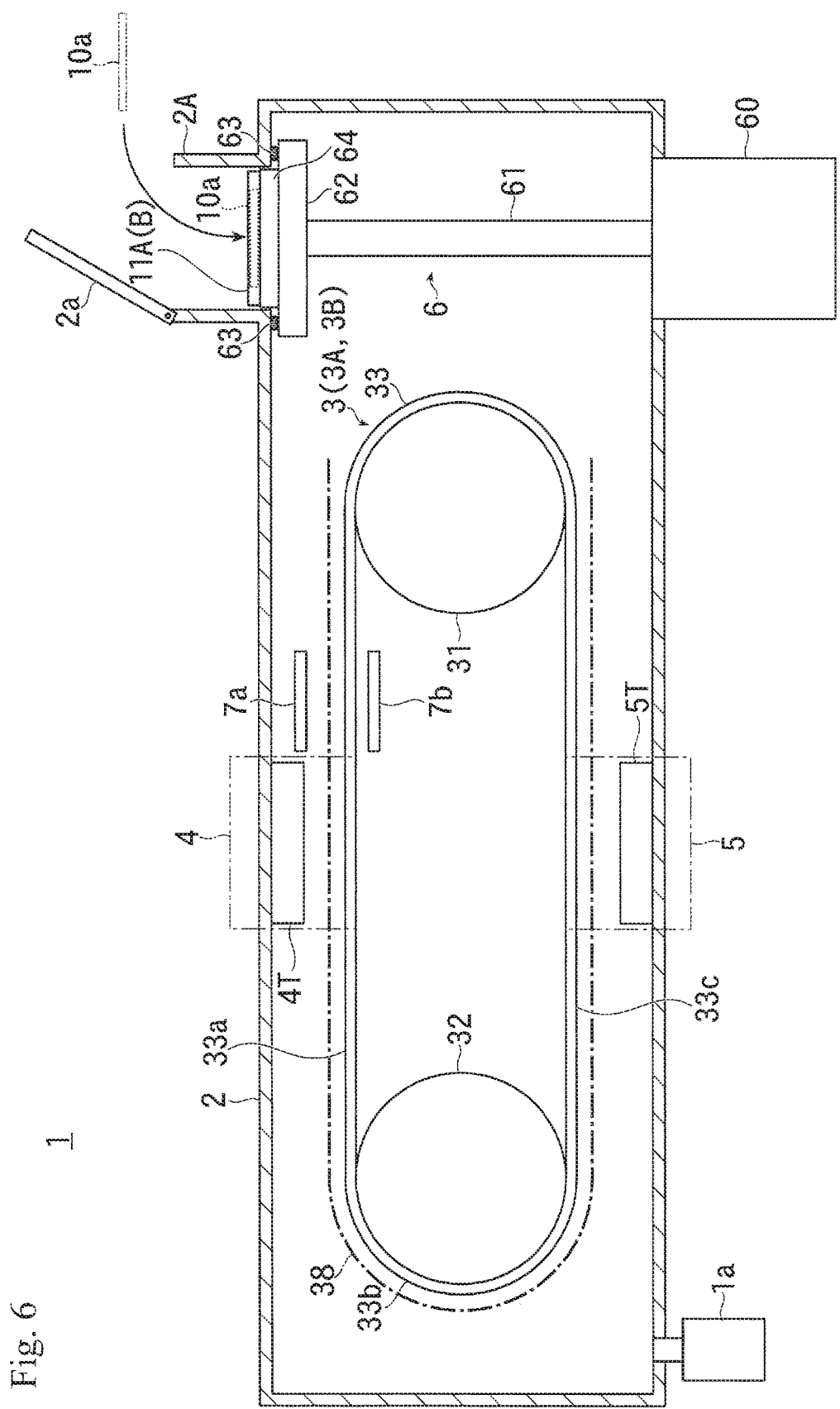
FIG. 6 is an explanatory view of an operation of the vacuum processing device of this embodiment (part 1).

First, while the seal member 63 on the support portion 62 of the substrate carry-in and carry-out mechanism 6 is tightly attached to the inner wall of the vacuum chamber 2, the ambience inside the substrate carry-in and carry-out chamber 2A is separated from the ambience inside the vacuum chamber 2. Under the foregoing condition, as illustrated in FIG. 6, the lid portion 2a of the substrate carry-in and carry-out chamber 2A is opened, and the pre-process substrate 10a is loaded on and held by the substrate holder 11A on the conveyance robot 64 of the support portion 62 of the substrate carry-in and carry-out mechanism 6, using a conveyance robot that is not illustrated in the drawings.

Figure 7:
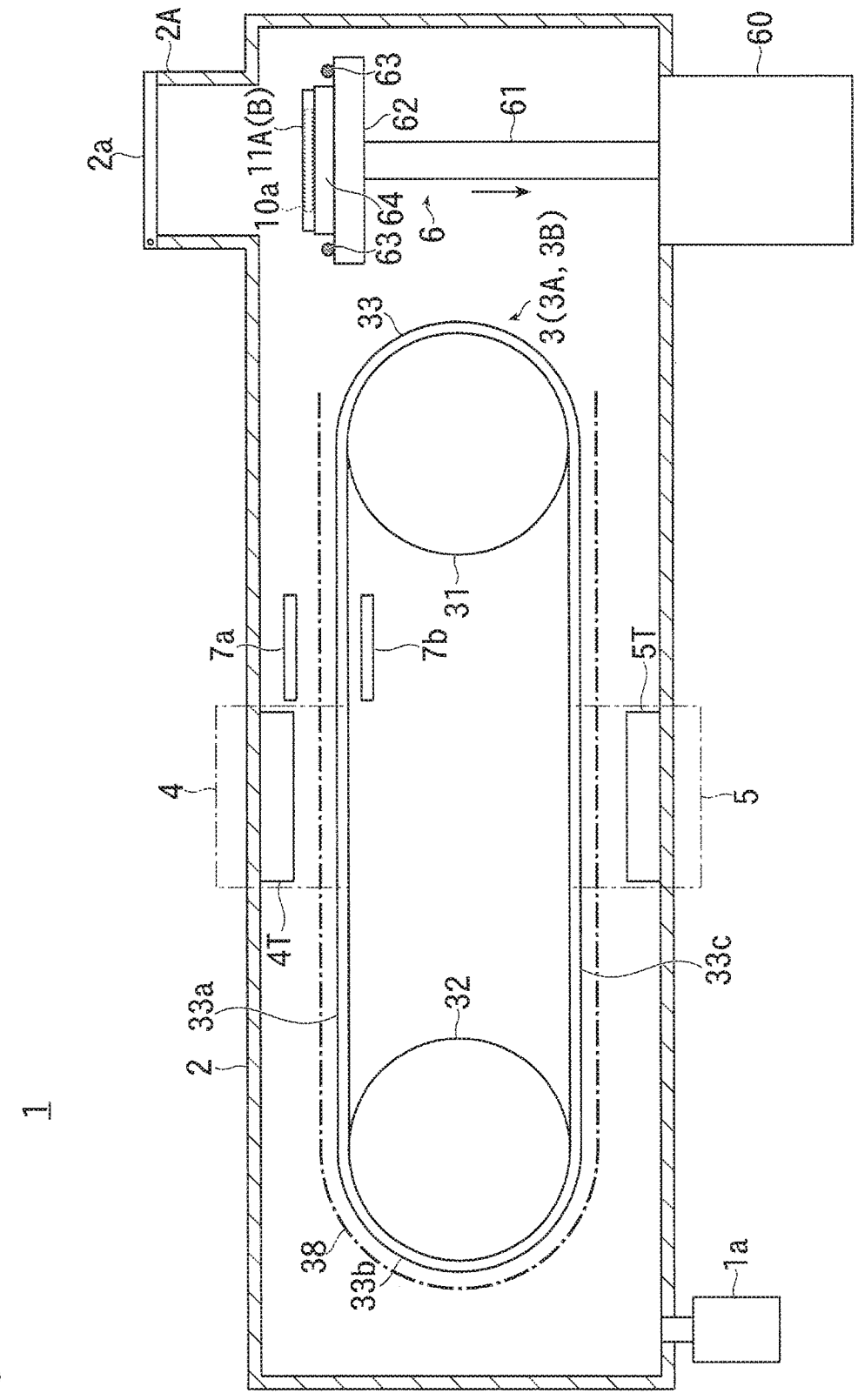
FIG. 7 is an explanatory view of the operation of the vacuum processing device of this embodiment (part 2).

Also, as illustrated in FIG. 7, after the lid portion 2a of the substrate carry-in and carry-out chamber 2A is closed, the support portion 62 of the substrate carry-in and carry-out mechanism 6 is lowered to the substrate holder passing position so that the position of the substrate holder 11A is as high as the position of the outward path-side conveyance portion 33a of the conveyance drive member 33.

Figure 8:
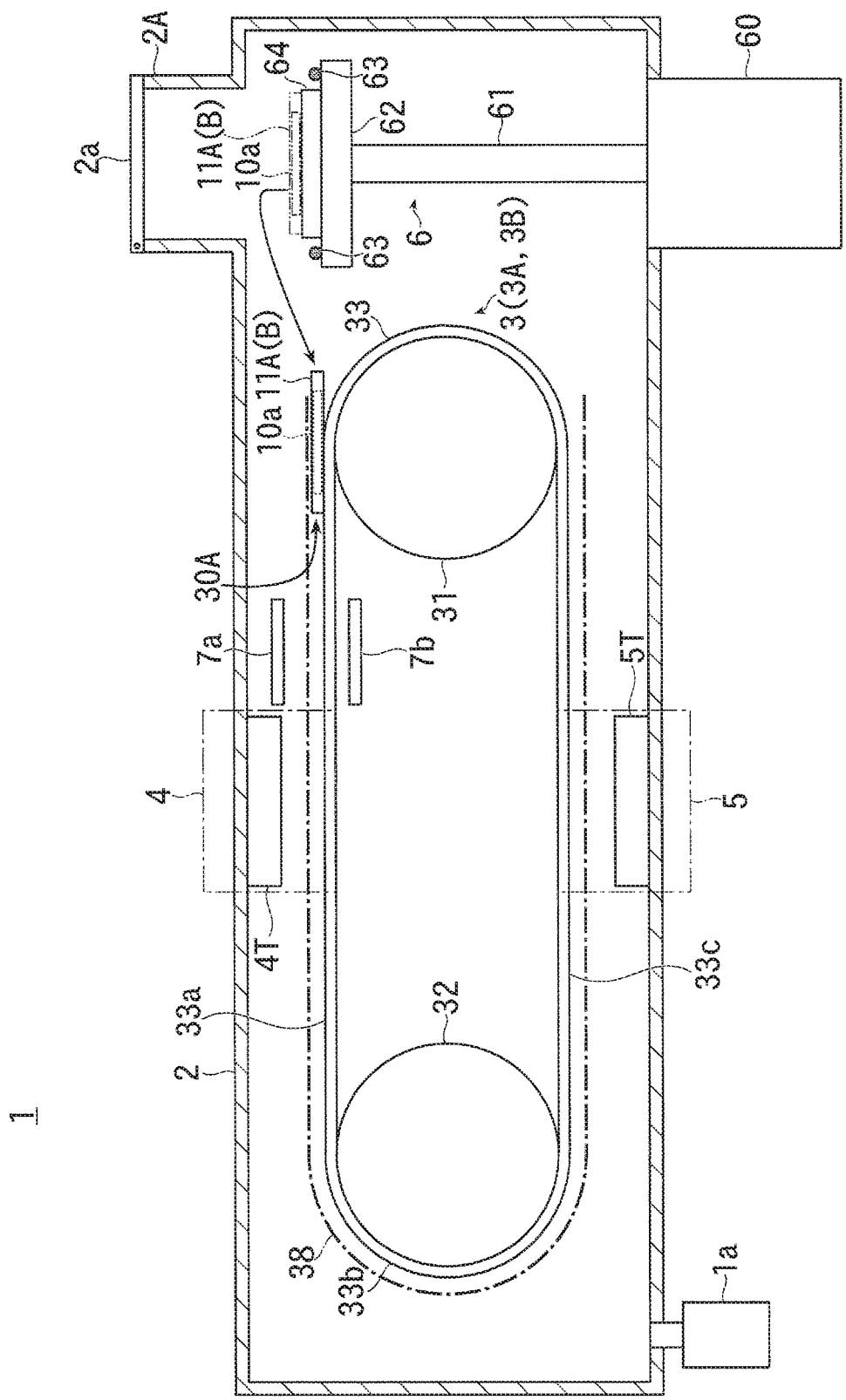
FIG. 8 is an explanatory view of the operation of the vacuum processing device of this embodiment (part 3).

In addition, as illustrated in FIG. 8, by the conveyance robot 64 provided to the support portion 62 of the substrate carry-in and carry-out mechanism 6, the substrate holder 11A is disposed on the substrate holder introduction portion 30A of the substrate holder conveyance mechanism 3.

In this manner, as illustrated in FIG. 9(a), a lower surface 11b of the substrate holder 11A is supported by the outward path-side substrate holder support mechanism 18a.

Next, the first and second drive wheels 31 and 32 of the substrate holder conveyance mechanism 3 are operated, so that the outward path-side conveyance portion 33a of the conveyance drive member 33 is moved from the first drive wheel 31 to the second drive wheel 32, and also the return path-side conveyance portion 33c of the conveyance drive member 33 is moved from the second drive wheel 32 to the first drive wheel 31.

As illustrated in FIG. 9(b), the holding recess portion 37 of the hold drive portion 36 provided on the conveyance drive member 33 is engaged with each of the pair of support shafts 12 of the substrate holder 11A, so that the support shaft 12 is held by the hold drive portion 36. Also, on the outward path-side conveyance portion 33a of the conveyance drive member 33, the substrate holder 11A is conveyed toward the conveyance turning portion 30B near the second drive wheel 32.

Consequently, when the substrate holder 11A and the pre-process substrate 10a are heated by the heating and cooling mechanisms 7a and 7b illustrated in FIG. 8 and in turn pass through the position of the first processing region 4, predetermined processing (for example, film formation) is performed on the surface of the pre-process substrate 10a, which is held by the substrate holder 11A, the surface being on the side of the first processing region 4 (hereinafter referred to as "first process surface").

Figure 10:
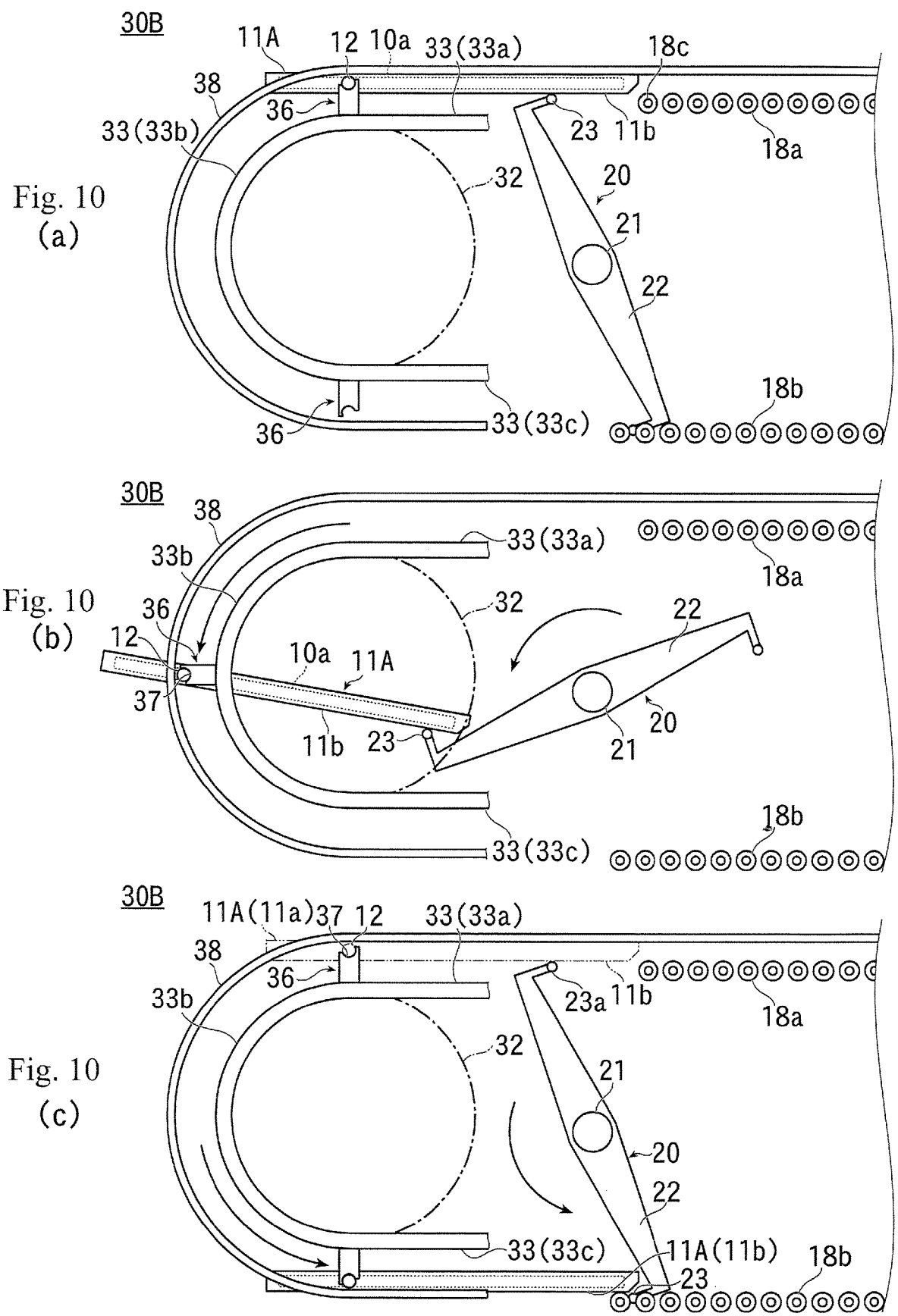
FIG. 10(a), FIG. 10(b) and FIG. 10(c) are explanatory views of operation of the conveying and turning portion of the substrate holder conveyance mechanism of the first example.

FIG. 10(a), FIG. 10(b) and FIG. 10(c) are explanatory views of operation of the conveying and turning portion of the substrate holder conveyance mechanism of the first example.

In this example, as described above, the support shaft 12 of the substrate holder 11A is held by the hold drive portion 36 of the conveyance drive member 33. Also, while the lower surface 11b of the substrate holder 11A is supported by the outward path-side substrate holder support mechanism 18a (see FIGS. 9(a) and 9(b)), the substrate holder 11A is conveyed toward the conveyance turning portion 30B.

In this example, as illustrated in FIG. 10(a), the dimensions of the substrate holder 11A, the position where the support shaft 12 is disposed, and the dimensions of the outward path-side substrate holder support mechanism 18a are set so that when the support shaft 12 of the substrate holder 11A reaches the upper portion of the second drive wheel 32 of the conveyance turning portion 30B, the rear end portion of the substrate holder 11A is removed from the terminal end portion 18c of the outward path-side substrate holder support mechanism 18a.

As described above, the substrate holder 11A is rotatable around the support shaft 12 as its center when the tip end portions 12b of the pair of support shafts 12 are each held by the holding recess portions 37 of the hold drive portion 36 of the conveyance drive member 33. In this example, the substrate holder 11A is configured to be kept horizontal with respect to the support shaft 12 of the substrate holder 11A by supporting the lower surface 11b on the rear end portion side using the support roller 23 provided at one end portion of the pair of support arms 22 of the posture control mechanism 20 when the substrate holder 11A is removed from the terminal end portion 18c of the outward path-side substrate holder support mechanism 18a.

As described above, this pair of support arms 22 of the posture control mechanism 20 is configured to rotate in the same direction as and in synchronization with the second drive wheel 32.

As illustrated in FIG. 10(b), in this example, as the conveyance drive member 33 moves, the hold drive portion 36 moves from the outward path-side conveyance portion 33a via the turning portion 33b to the return path-side conveyance portion 33c.

During this movement, the support shaft 12 of the substrate holder 11A moves circularly along the periphery of the second drive wheel 32 for lowering. However, in this example, during the aforementioned operation, the dimensions and rotational angle of the support arm 22 of the posture control mechanism 20 are set so that the lower surface 11b on the rear end portion side of the substrate holder 11A is supported by the support roller 23, which is at one end portion of the pair of support arms 22 of the posture control mechanism 20, and that the substrate holder 11A is kept substantially horizontal.

Also, during this movement, as the support shaft 12 of the substrate holder 11A supported by the holding recess portion 37 of the hold drive portion 36 is located below the holding recess portion 37 of the hold drive portion 36, gravitational action, which produces a force acting on the support shaft 12 of the substrate holder 11A in a direction away from the holding recess portion 37 of the hold drive portion 36, occurs. However, in this example, each tip end portion 12b of the support shaft 12 of the substrate holder 11A is engaged with and held by the holding recess portion 37 of the hold drive portion 36 of the conveyance drive member 33. As a small gap is formed between the tip end portion 12b of the support shaft 12 of the substrate holder 11A and the guide member 38 in the configuration of this example, the tip end portion 12b of the support shaft 12 of the substrate holder 11A is brought into contact with and supported by the inner portion of the guide member 38 when a small gap is formed between the tip end portion 12b and the holding recess portion 37 of the hold drive portion 36.

Consequently, in this example, when the substrate holder 11A passes through the conveyance turning portion 30B, the substrate holder 11A does not fall from the hold drive portion 36 of the conveyance drive member 33.

Also, as illustrated in FIG. 10(c), when the support shaft 12 of the substrate holder 11A reaches the lower portion of the second drive wheel 32 of the conveyance turning portion 30B, the end portion on the side opposite to the side where the support shaft 12 of the substrate holder 11A is provided is the tip end portion in the conveyance direction. At this stage in this example, the dimensions and rotational angle of the support arm 22 of the posture control mechanism 20 are set so that the lower surface 11b at the tip end portion of the substrate holder 11A is smoothly supported by the return path-side substrate holder support mechanism 18b and that the support roller 23 of the support arm 22 is separated away from the lower surface 11b of the substrate holder 11A.

Also, at this stage of this example, the dimensions and rotational angle of the support arm 22 of the posture control mechanism 20 are set so that the support roller 23a at the end portion on the side opposite to the support arm 22 side supports the lower surface 11b of the subsequent substrate holder 11A.

Figure 11:
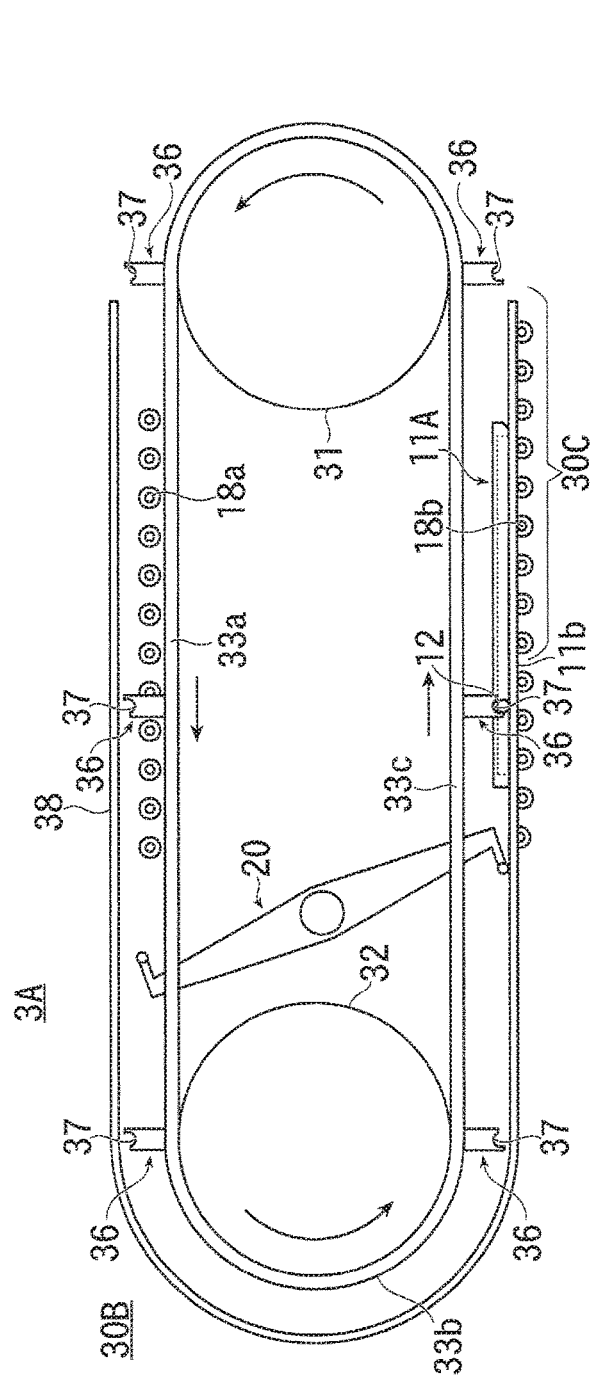
FIGS. 11(a) and 11(b) are explanatory views of the operation of the substrate holder conveyance mechanism of the first example (part 2).
Figure 11:
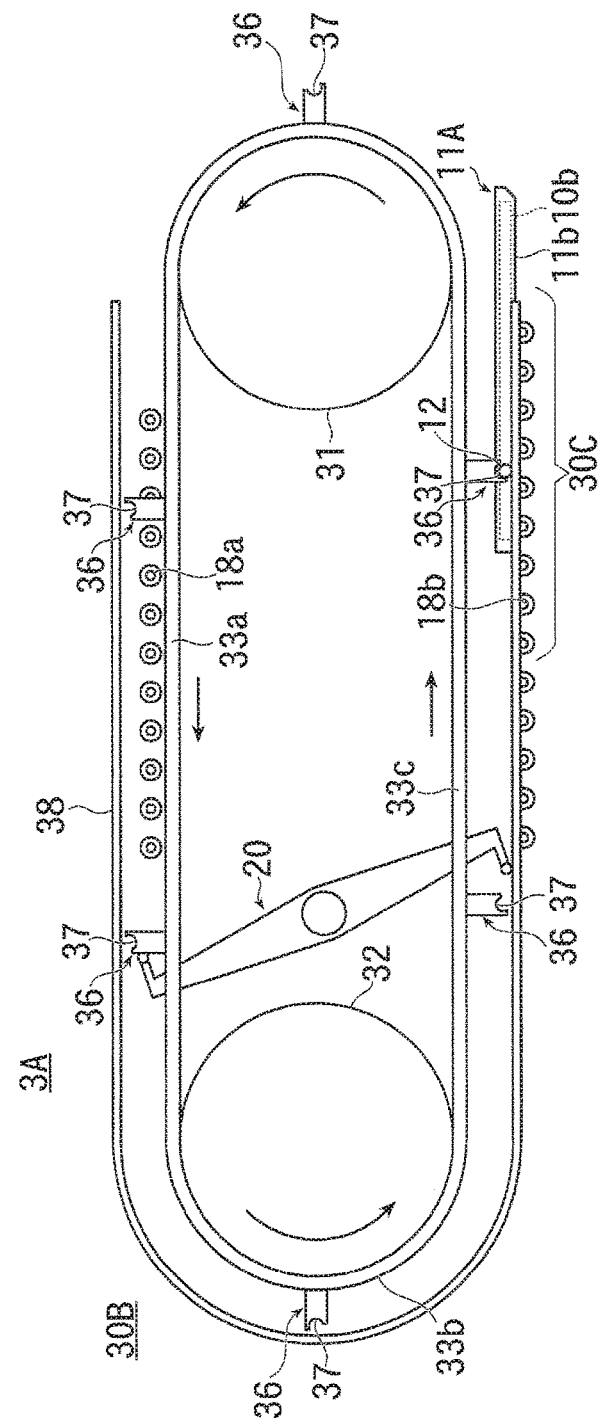

Thereafter, by continuing the operation of the first and second drive wheels 31 and 32 of the substrate holder conveyance mechanism 3A, as illustrated in FIGS. 11(a) and 11(b), the substrate holder 11A supported by the return path-side substrate holder support mechanism 18b is moved from the conveyance turning portion 30B to the substrate holder ejection portion 30C by the operation of the hold drive portion 36 of the return path-side conveyance portion 33c of the conveyance drive member 33.

In this operation, predetermined processing (for example, film formation) is performed on the substrate holder 11A and the pre-process substrate 10a, only one of whose surfaces has been processed by a second processing source 5T, during the passage of the position of the second processing region 5 as illustrated in FIG. 7.

As described above, at the conveyance turning portion 30B of the substrate holder conveyance mechanism 3A of this example, the substrate holder 11A is not turned upside down, but the front and rear sides are reversed in the conveyance direction. Consequently, predetermined processing is performed on the second surface on the side opposite to the first process surface (hereinafter referred to as "second process surface") of the substrate 10a held by the substrate holder 11A, whereby the post-process substrate 10b is obtained.

Figure 12:
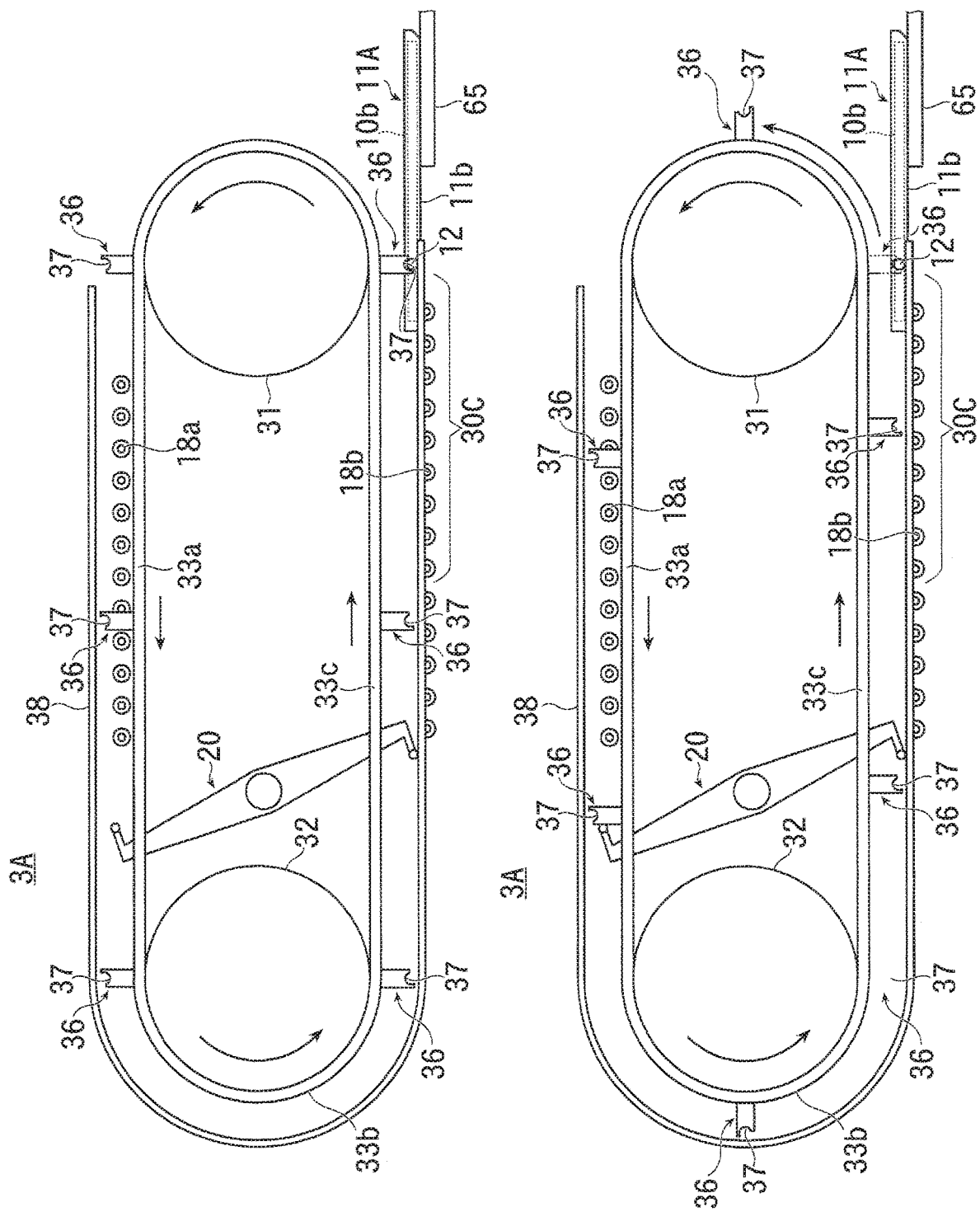
FIGS. 12(a) and 12(b) are explanatory views of the operation of the substrate holder conveyance mechanism of the first example (part 3).

Subsequently, after the substrate holder 11A reaches the substrate holder ejection portion 30C and then reaches the terminal end portion of the guide member 38 of the substrate holder ejection portion 30C, as illustrated in FIG. 12(a), the portion of the substrate holder 11A on the downstream (front) side in the conveyance direction protrudes from the terminal end portion of the return path-side substrate holder support mechanism 18b and the guide member 38. Under the foregoing condition, the support portion 62 of the substrate carry-in and carry-out mechanism 6 is disposed at the substrate holder removal position (see FIG. 13), and the lower surface 11b of the substrate holder 11A is supported by a mount portion 65 constituting the aforementioned conveyance robot 64 of the substrate carry-in and carry-out mechanism 6.

Also, by continuing the operation of the conveyance drive member 33, the hold drive portion 36 that moves together with the circular conveyance drive member 33 at the periphery of the first drive wheel 31 separates from the support shaft 12 of the substrate holder 11A and moves upward together with the arc-shaped section of the conveyance drive member 33. As illustrated in FIG. 12(b), engagement between the hold drive portion 36 of the conveyance drive member 33 and the support shaft 12 of the substrate holder 11A is released, and at that position, the substrate holder 11A stops.

Figure 13:
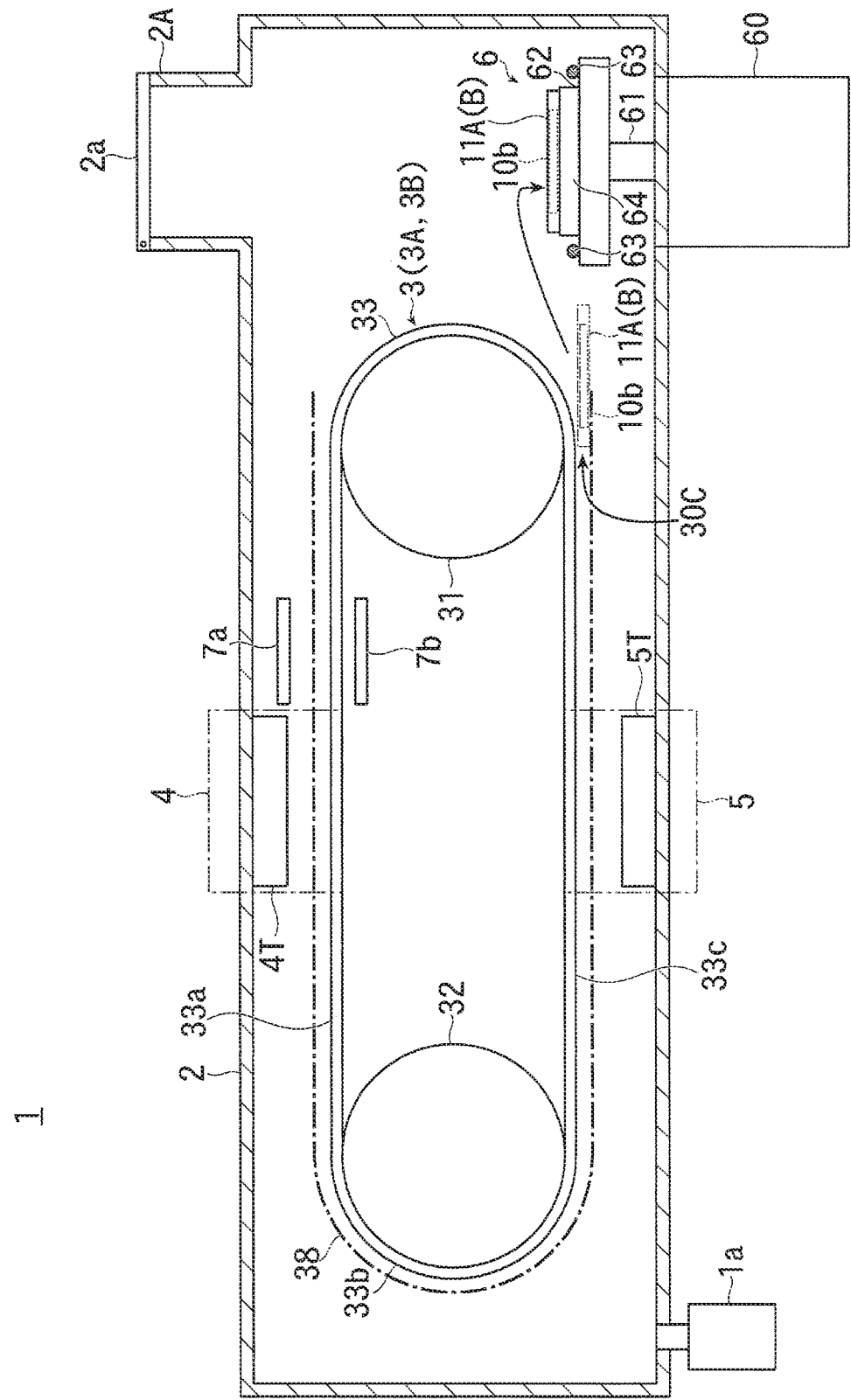
FIG. 13 is an explanatory view of the operation of the vacuum processing device of this embodiment (part 4).

As illustrated in FIG. 13, the conveyance robot 64 of the substrate carry-in and carry-out mechanism 6 is used to remove the substrate holder 11A from the substrate holder ejection portion 30C to the side of the substrate carry-in and carry-out mechanism 6, so that the substrate holder 11A is disposed together with the conveyance robot 64 on the support portion 62.

Figure 14:
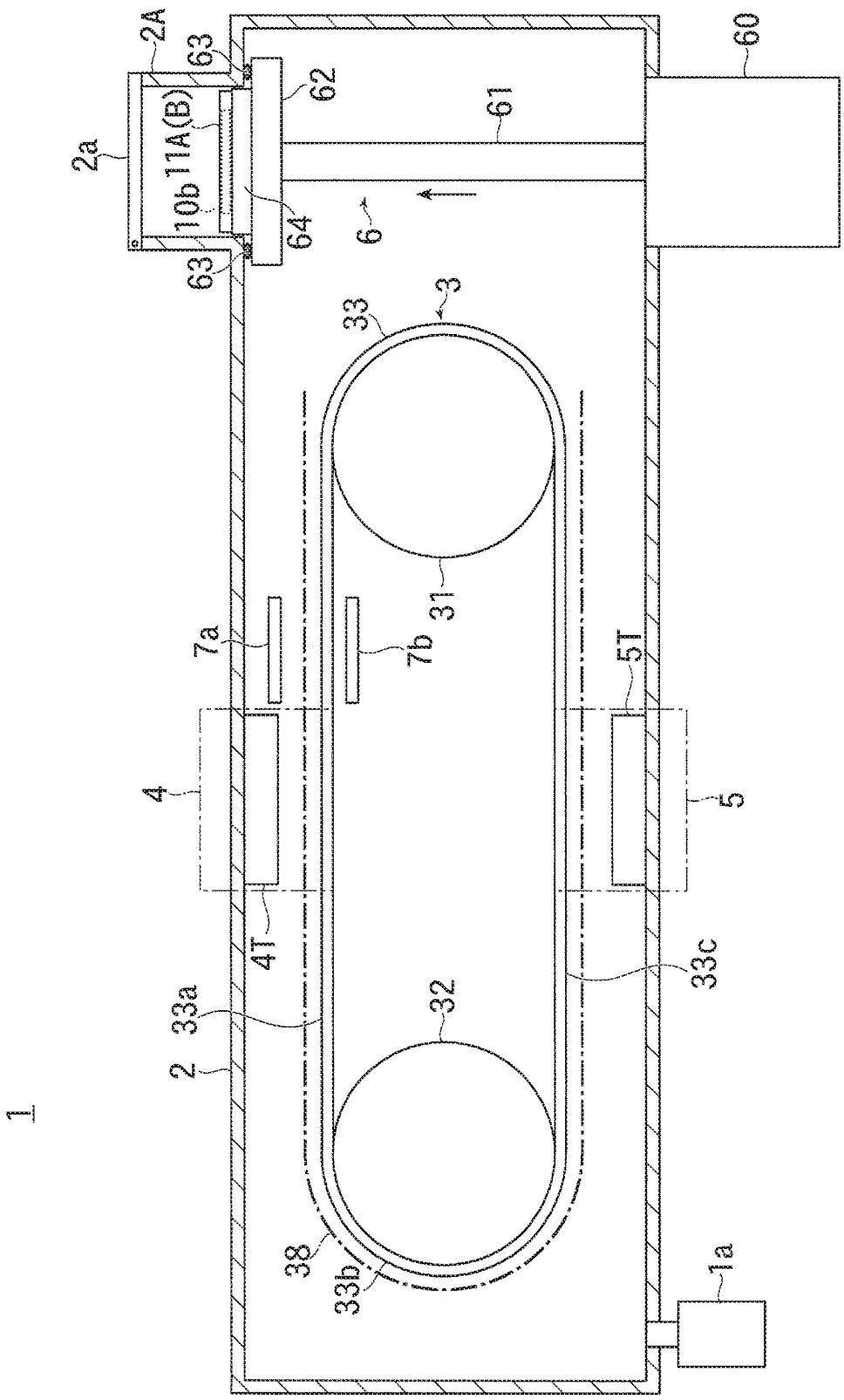
FIG. 14 is an explanatory view of the operation of the vacuum processing device of this embodiment (part 5).

Subsequently, as illustrated in FIG. 14, the support portion 62 of the substrate carry-in and carry-out mechanism 6 is lifted, and the seal member 63 on the support portion 62 is tightly attached to the inner wall of the vacuum chamber 2 to separate the ambience inside the vacuum chamber 2 from the ambience inside the substrate carry-in and carry-out chamber 2A.

Figure 15:
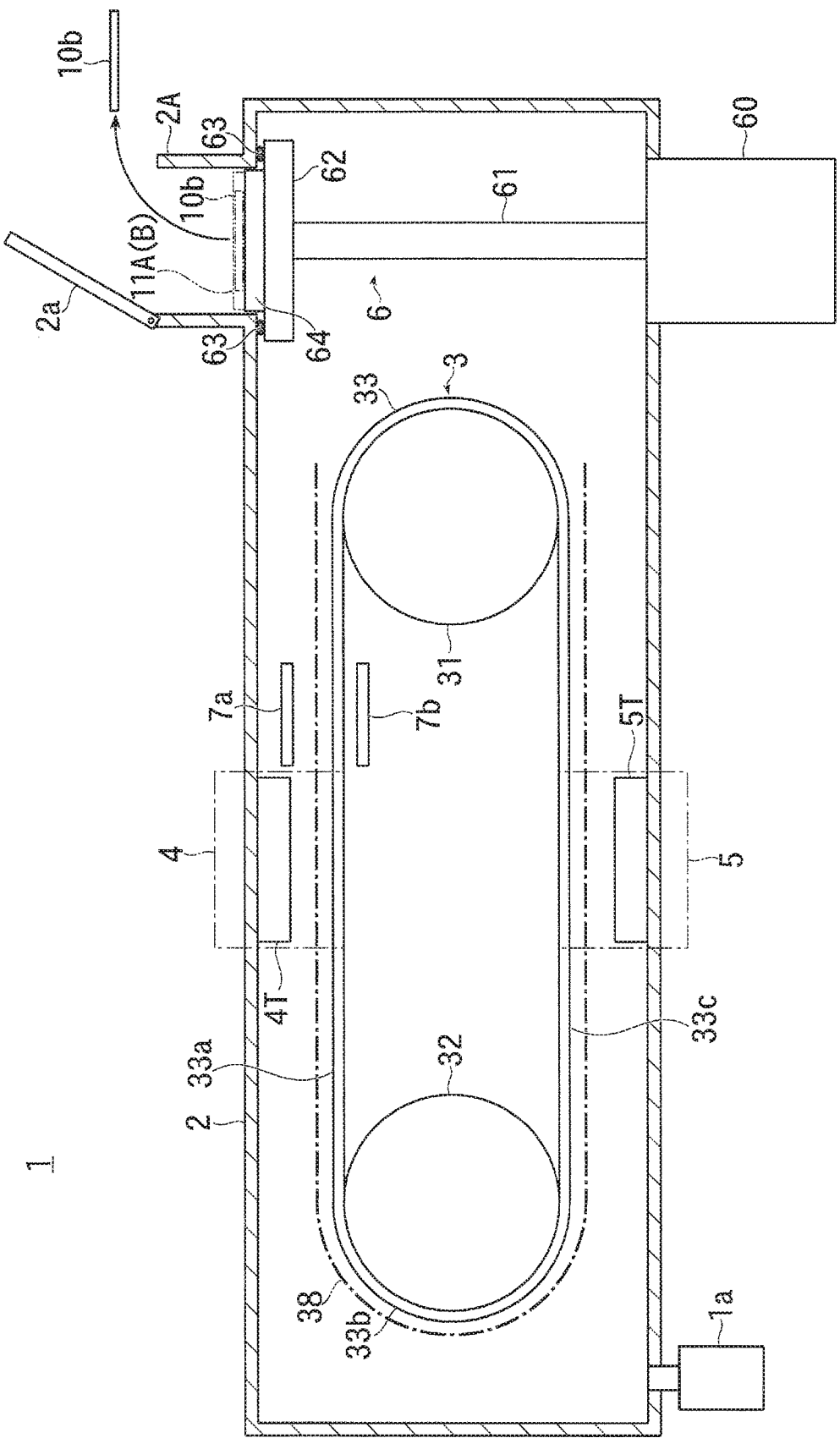
FIG. 15 is an explanatory view of the operation of the vacuum processing device of this embodiment (part 6).

As illustrated in FIG. 15, the lid portion 2a of the substrate carry-in and carry-out chamber 2A is then opened, and a conveyance robot (not illustrated in the drawings) is used to remove the post-process substrate 10b from the substrate holder 11A to the outside air.

In this manner, each process on the pre-process substrate 10a is completed, and the post-process substrate 10b, on whose first and second process surfaces predetermined processing has been performed, can be used.

As described above, in this embodiment where the substrate holder conveyance mechanism 3A of the first example is included, a conveyance path is formed as a single annular path when the conveyance path is projected onto a plane (vertical plane in this embodiment) containing: a normal line of an arbitrary point on the planar process surface of the substrate 10 conveyed through the conveyance path, and a trajectory line drawn by the arbitrary point on the process surface of the substrate 10 when the substrate 10 passes straight through the first and second processing regions 4 and 5. Therefore, a space occupied by the conveyance path can be significantly reduced compared with the conventional technique by, for example, using a conveyance path formed to be annular when the conveyance path is projected onto a plane in parallel with a planar process surface of a substrate, whereby the present invention achieves significant space saving in the vacuum processing device 1.

Also, in this embodiment, a plurality of the substrate holders 11A, which hold and align a plurality of the substrates 10 in the orthogonal conveyance direction orthogonal to the conveyance direction, are configured to be conveyed along the conveyance path. In comparison with the conventional technique of performing processing (such as, film formation) by conveying a substrate holder that holds and aligns a plurality of substrates in the substrate conveyance direction, the length of the substrate holder and its associated redundant space can be reduced, whereby additional space saving can be achieved.

Also, in this embodiment, a compact vacuum processing device that performs processing (such as, film formation) on both surfaces of the substrate 10 can be provided.

Moreover, in this embodiment, since the substrate holder conveyance mechanism 3A is integrally assembled to the frame structure body 8 that is removably attached to the vacuum chamber 2, the manufacturing process and maintenance can be readily conducted.

Meanwhile, in this embodiment, the vacuum processing device has the substrate carry-in and carry-out chamber 2A, and the substrate carry-in and carry-out chamber 2A is configured so that the ambience thereof is communicable with or separable from the ambience of the vacuum chamber 2 and is configured to enable the substrate 10 to be carried into and out of the vacuum chamber 2. In the vacuum chamber 2, the substrate carry-in and carry-out mechanism 6 has the conveyance robot 64 that carries the substrate holder 11A that holds the pre-process substrate 10a from inside the substrate carry-in and carry-out chamber 2A to the vacuum chamber 2 to pass the substrate holder 11A to the substrate holder introduction portion 30A of the substrate holder conveyance mechanism 3A and removes the substrate holder 11A that holds the post-process substrate 10b from the substrate holder ejection portion 30C of the substrate holder conveyance mechanism 3A to carry the substrate holder 11A into the substrate carry-in and carry-out chamber 2A. This substrate carry-in and carry-out mechanism 6 has the support portion 62 that moves between the substrate holder passing position, where the substrate holder 11A that holds the pre-process substrate 10a is passed to the substrate holder introduction portion 30A of the substrate holder conveyance mechanism 3A, and the substrate holder removal position, where the substrate holder 11A that holds the post-process substrate 10b is removed from the substrate holder ejection portion 30C of the substrate holder conveyance mechanism 3A. Accordingly, the efficiency of carry-in and carry-out of a plurality of the substrate holders 11A and the efficiency in processing the substrate 10 can be significantly enhanced.

In addition, the distance between the position where the vacuum chamber 2 and the substrate carry-in and carry-out chamber 2A communicate with each other (communication channel 2B) and the substrate holder passing position (substrate holder introduction portion 30A) is shorter than the distance between the position where the vacuum chamber 2 and the substrate carry-in and carry-out chamber 2A communicate with each other (communication channel 2B) and the substrate holder removal position (substrate holder ejection portion 30C). Accordingly, the substrate holder 11A can be passed at an appropriate timing, whereby the efficiency of carry-in and carry-out of a plurality of the substrate holders 11A can be significantly enhanced.

Meanwhile, in this embodiment, the support portion 62 of the substrate carry-in and carry-out mechanism 6 is configured to be movable to a position where the vacuum chamber 2 and the substrate carry-in and carry-out chamber 2A communicate with each other. This support portion 62 is configured to move to a communicable position to block the communication channel 2B between the vacuum chamber 2 and the substrate carry-in and carry-out chamber 2A by the support portion 62, whereby the ambience of the substrate carry-in and carry-out chamber 2A is separated from the ambience of the vacuum chamber 2. Accordingly, a vacuum processing device having a simply configured vacuum chamber and load lock chamber can be provided.

Also, in this embodiment, the heating and cooling mechanisms 7a and 7b for heating the substrate holder 11A that holds the pre-process substrate 10a are provided. However, in this embodiment, carry-in and carry-out of the substrate holder 11A is performed not in the vacuum chamber 2 or in the outside air, but between the vacuum chamber 2 and the substrate carry-in and carry-out chamber 2A. Consequently, compared with removing the substrate holder 11A having a surface area and thermal capacity much greater than that of the substrate 10 to the outside air, the embodiment of the present invention can readily maintain the processing environment. The heating time can be shortened as well, whereby energy-saving can be achieved.

Moreover, in this embodiment, the conveyance robot 64 is provided on the support portion 62 that is movable upward and downward in the vertical direction of the substrate carry-in and carry-out mechanism 6. Also, the substrate holder 11A supported on this conveyance robot 64 is moved upward and downward in the vertical direction, and the substrate holder 11A is passed and received between the conveyance robot 64 and the substrate holder conveyance mechanism 3. Only one set of mechanism and electrical components (such as, actuators and links) constituting the conveyance robot 64 are needed. Therefore, the advantageous effect of simplifying the configuration of the passing/receiving portion of the substrate holder 11A in the substrate carry-in and carry-out mechanism 6 can be achieved.

Figure 16:
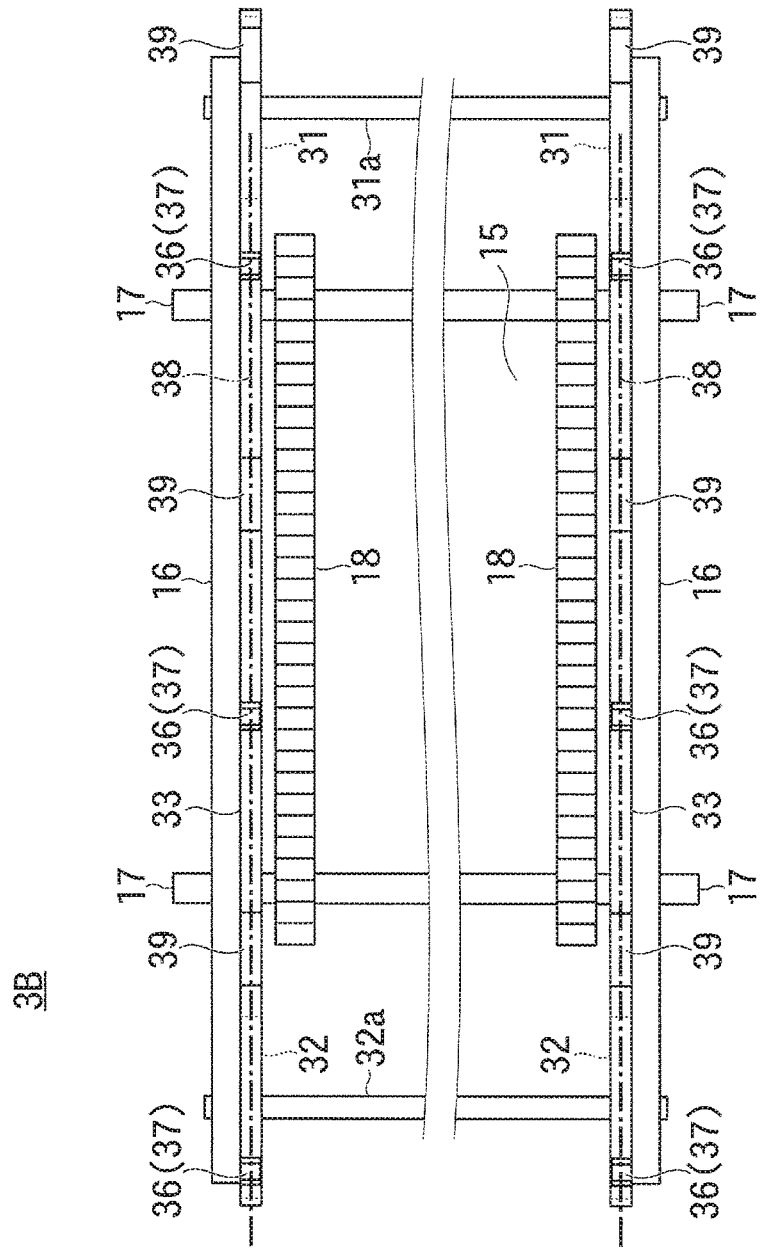
FIG. 16 is a plan view illustrating a schematic configuration of a second example of a substrate holder conveyance mechanism.
Figure 17:
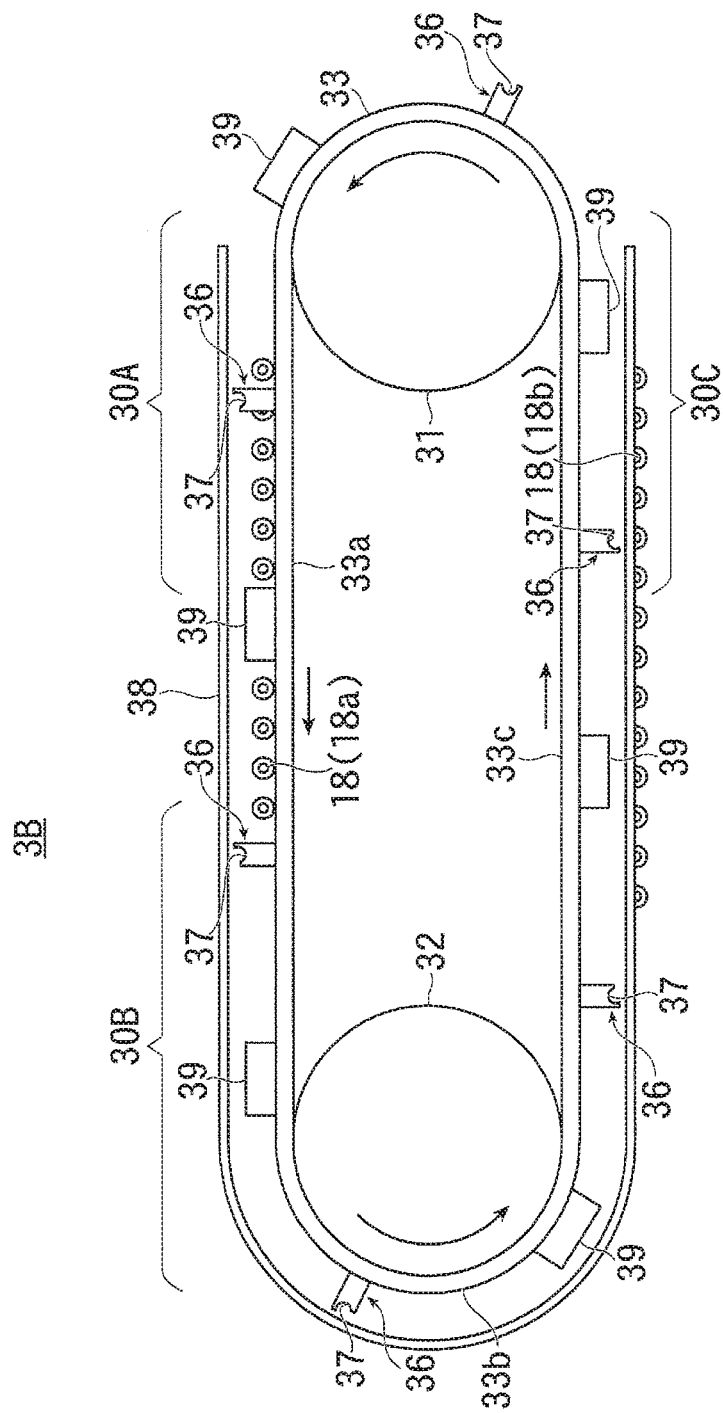
FIG. 17 is a front view illustrating main portions of the second example of the substrate holder conveyance mechanism.
Figure 18:
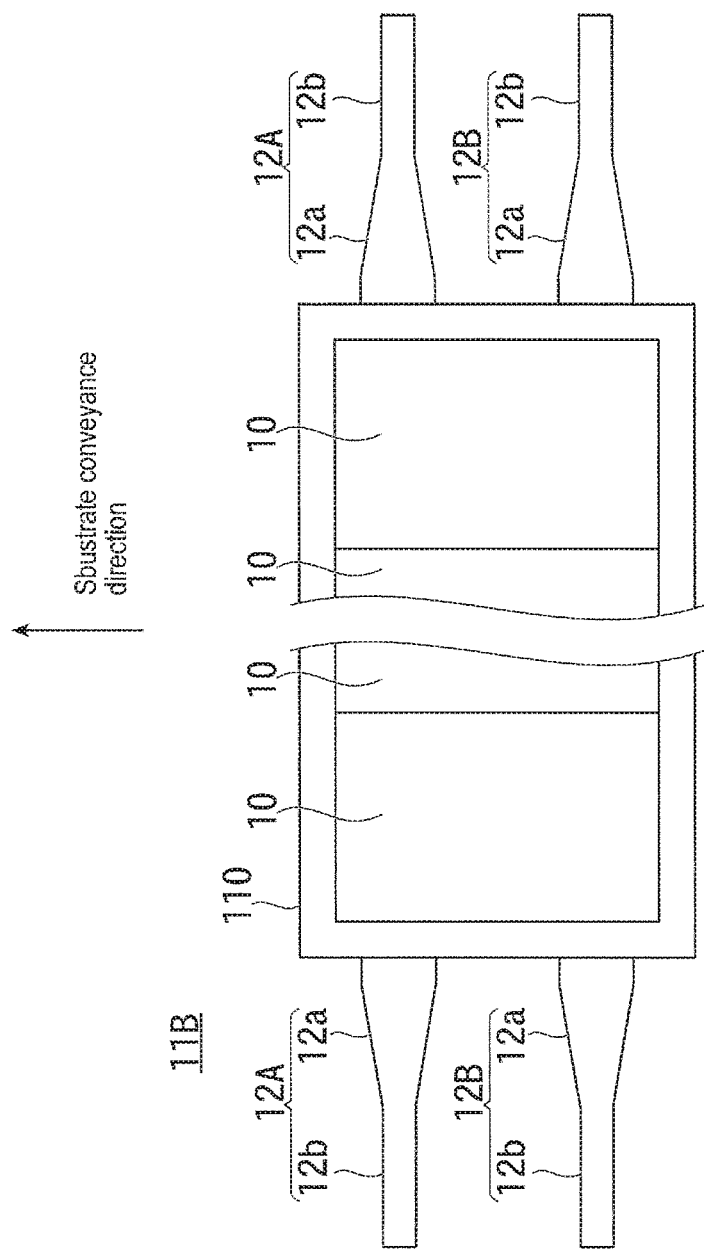
FIG. 18 is a plan view illustrating a configuration of a substrate holder used in this example.

FIG. 16 is a plan view illustrating a schematic configuration of a second example of a substrate holder conveyance mechanism. FIG. 17 is a front view illustrating main portions of the substrate holder conveyance mechanism. FIG. 18 is a plan view illustrating a configuration of a substrate holder used in this example. FIG. 19(a), FIG. 19(b), FIG. 20(a), FIG. 20(b), FIG. 21(a), FIG. 21(b), FIG. 22(a) and FIG. 22(b) are explanatory views illustrating the operation of this example.

Hereinbelow, elements corresponding to those of the aforementioned substrate holder conveyance mechanism 3A of the first example are denoted by the same reference numerals as those assigned to the corresponding elements, and such corresponding elements are not described in detail.

As illustrated in, for example, FIG. 16, a substrate holder conveyance mechanism 3B of this example has, as in the case of the first example, a pair of first and second drive wheels 31 and 32 with an identical diameter, which are provided to each of a pair of side frames 16. These first and second drive wheels 31 and 32 are configured to rotate around, as respective centers thereof, around drive shafts 31a and 32a, which rotate around, as a center thereof, the rotation axis line running in the direction orthogonal to the substrate conveyance direction.

In the substrate holder conveyance mechanism 3B of this example, the aforementioned conveyance drive members 33 are placed over the pair of respective first and second drive wheels 31 and 32. On these conveyance drive members 33, a plurality of the aforementioned hold drive portions 36 and a plurality of auxiliary support portions 39, the number of which is equal to that of the hold drive portions 36, are provided.

The hold drive portions 36 and the auxiliary support portions 39 are formed as pairs.

As illustrated in FIG. 18, the substrate holder 11B used in this example is configured to have the main body 110, whose shape is identical to that of the substrate holder 11A of the first example, as well as to hold and align a plurality of the substrates 10 in, for example, a single row in the longitudinal direction of this main body 110.

The substrate holder 11B of this example is directed to the formation of a film on one surface of the substrate 10. Here, there is no need to configure the substrate holder 11B so that both surfaces of the substrate 10 are exposed.

In this example, at both end positions of the main body 110 of the substrate holder 11B in the longitudinal direction thereof, two pairs of the support shafts 12A and 12B whose configuration is identical to that of the substrate holder 11A of the first example are arranged at a predetermined interval in the width direction of the main body 110.

Of the pair of support shafts 12A and 12B, the shaft on the front side in the substrate conveyance direction is defined as the front-side support shaft 12A, and the shaft on the rear side is defined as the rear-side support shaft 12B.

As illustrated in FIGS. 19(a) and 19(b), as in the case of the substrate holder 11A of the first example, each tip end portion 12b of the front-side support shaft 12A of the substrate holder 11B is configured to be engaged with the holding recess portion 37 of the hold drive portion 36 of the conveyance drive member 33 and supported rotatably around the front-side support shaft 12A as its center.

The auxiliary support portion 39 of the conveyance drive member 33 serves to support the rear-side support shaft 12B of the substrate holder 11B. For example, its top portion is formed as a plane. The length of this auxiliary support portion 39 in the conveyance direction is set to be greater than the outer diameter of the rear-side support shaft 12B of the substrate holder 11B.

Also, in this example, when each tip end portion 12b of the rear-side support shaft 12B of the substrate holder 11B is supported by the auxiliary support portion 39 of the conveyance drive member 33, a small gap is formed between the tip end portion 12b of the rear-side support shaft 12B of the substrate holder 11B and the guide member 38.

In addition, the aforementioned hold drive portion 36 and the auxiliary support portion 39 of the conveyance drive member 33 are configured to have an identical pitch with that of the front-side support shaft 12A and the rear-side support shaft 12B of the substrate holder 11B.

A description will now be given of the operation of the vacuum processing device 1 of this embodiment having the substrate holder conveyance mechanism 3B of the second example.

In this example, for ease of understanding, a case where processing is performed while the substrate 10 is held by one substrate holder 11B to perform processing will be described as an example.

First, in the same method as the method of the first example where the substrate holder conveyance mechanism 3A is included, the substrate holder 11B is disposed on the substrate holder introduction portion 30A of the substrate holder conveyance mechanism 3B of the second example (see FIG. 6, FIG. 7 and FIG. 8).

In this manner, as illustrated in FIG. 19(a), the lower surface 11b of the substrate holder 11B is supported by the outward path-side substrate holder support mechanism 18a.

Next, by operating the first and second drive wheels 31 and 32 of the substrate holder conveyance mechanism 3B, the outward path-side conveyance portion 33a of the conveyance drive member 33 is moved from the first drive wheel 31 to the second drive wheel 32, and the return path-side conveyance portion 33c of the conveyance drive member 33 is moved from the second drive wheel 32 to the first drive wheel 31.

In this manner, as illustrated in FIG. 19(b), the holding recess portion 37 of the hold drive portion 36 on the conveyance drive member 33 is engaged with the front-side support shaft 12A of the substrate holder 11B, so that the front-side support shaft 12A is held by the hold drive portion 36. Moreover, the top portion of the auxiliary support portion 39 on the conveyance drive member 33 comes into contact with the rear-side support shaft 12B of the substrate holder 11B, so that the rear-side support shaft 12B is supported by the top portion of the auxiliary support portion 39 of the support shaft 12B.

Also, under the foregoing condition, the substrate holder 11B is conveyed on the outward path-side conveyance portion 33a of the conveyance drive member 33 toward the conveyance turning portion 30B.

In addition, after heating the substrate holder 11B and the pre-process substrate 10a by the heating and cooling mechanisms 7a and 7b illustrated in FIG. 8, predetermined processing (for example, formation of a first layer film) is performed on the process surface of the pre-process substrate 10a held by the substrate holder 11B when the substrate holder 11B passes through the position of the first processing region 4.

FIGS. 20(a) and 20(b) and FIGS. 21(a) and 20(b) are explanatory views illustrating the operation of the conveyance turning portion 30B of the substrate holder conveyance mechanism of the second example.

In this example, as illustrated in FIG. 20(a), the front-side support shaft 12A of the substrate holder 11B is held by the hold drive portion 36 of the conveyance drive member 33. Also, the rear-side support shaft 12B of the substrate holder 11B is conveyed toward the conveyance turning portion 30B while being supported by the auxiliary support portion 39 of the conveyance drive member 33.

At the conveyance turning portion 30B, as illustrated in FIG. 20(b), the front-side support shaft 12A of the substrate holder 11B is held by the hold drive portion 36 of the conveyance drive member 33. Also, while the rear-side support shaft 12B of the substrate holder 11B is supported by the auxiliary support portion 39 of the conveyance drive member 33, the tip end portion of the substrate holder 11B in the moving direction starts lowering.

During this movement, as the front-side support shaft 12A of the substrate holder 11B held by the holding recess portion 37 of the hold drive portion 36 is located below the holding recess portion 37 of the hold drive portion 36, gravitational action produces a force acting on the front-side support shaft 12A of the substrate holder 11B in a direction away from the holding recess portion 37 of the hold drive portion 36. However, in this example, as in the case of the first example, each tip end portion 12b of the front-side support shaft 12A of the substrate holder 11B is engaged with and held by the holding recess portion 37 of the hold drive portion 36 of the conveyance drive member 33. Under the foregoing condition, as a small gap is formed between the tip end portion 12b of the front-side support shaft 12A of the substrate holder 11A and the guide member 38, the front-side support shaft 12A of the substrate holder 11B is brought into contact with and supported by the inner portion of the guide member 38 when a small gap is formed between the front-side support shaft 12A and the holding recess portion 37 of the hold drive portion 36.

In this example, each tip end portion 12b of the rear-side support shaft 12B of the substrate holder 11B is supported by the auxiliary support portion 39 of the conveyance drive member 33. Under the foregoing condition, as a small gap is formed between the tip end portion 12b of the rear-side support shaft 12B of the substrate holder 11B and the guide member 38, the rear-side support shaft 12B of the substrate holder 11B is brought into contact with and supported by the inner portion of the guide member 38 when a small gap is formed between the rear-side support shaft 12B and the auxiliary support portion 39.

Consequently, in this example, as illustrated in FIG. 21(a), even when the substrate holder 11B is turned upside down, the substrate holder 11B does not fall from the hold drive portion 36 when the substrate holder 11B passes through the conveyance turning portion 30B.

Also, when the substrate holder 11B passes through the conveyance turning portion 30B, the substrate holder 11B passes through a conveyance path with a curved trajectory. The distance between the hold drive portion 36 and the auxiliary support portion 39 on the conveyance drive member 33 differs in the straight section of the conveyance path and in the curved section thereof. In this example, the length of the auxiliary support portion 39 in the conveyance direction is greater than the outer diameter of the rear-side support shaft 12B of the substrate holder 11B. Consequently, the contact portion between the rear-side support shaft 12B of the substrate holder 11B and the top portion of the auxiliary support portion 39 moves along the top portion of the auxiliary support portion 39 when the substrate holder 11B passes through the conveyance turning portion 30B. In this manner, the substrate holder 11B can smoothly pass through the curved conveyance turning portion 30B.

Subsequently, by continuing the operation of the first and second drive wheels 31 and 32 of the substrate holder conveyance mechanism 3B, as illustrated in FIGS. 22(a) and 22(b), the substrate holder 11B supported by the return path-side substrate holder support mechanism 18b is moved by operation of the hold drive portion 36 of the return path-side conveyance portion 33c of the conveyance drive member 33 from the conveyance turning portion 30B to the substrate holder ejection portion 30C.

During this operation, a predetermined processing (for example, film formation) is performed on the substrate holder 11B and the first processed substrate 10a by the second processing source 5T when the substrate holder 11B passes through the position of the second processing region 5 illustrated in FIG. 8.

As described above, at the conveyance turning portion 30B of the substrate holder conveyance mechanism 3B of this example, the substrate holder 11B is turned upside down, and the front and rear sides are not reversed in the conveyance direction. For example, a second layer film is formed on, for example, a first layer film on the process surface of the substrate 10a held by the substrate holder 11B, whereby the post-process substrate 10b is acquired.

Subsequently, after the substrate holder 11B reaches the substrate holder ejection portion 30C and the substrate holder 11B reaches the terminal end portion of the guide member 38 of the substrate holder ejection portion 30C, as illustrated in FIG. 22(b), the portion of the substrate holder 11B on the downstream (front) side in the conveyance direction protrudes from the terminal end portion of the return path-side substrate holder support mechanism 18b and the guide member 38. Under the foregoing condition, the upper surface 11a of the substrate holder 11B is supported by the mount portion 65 constituting the aforementioned conveyance robot 64 of the substrate carry-in and carry-out mechanism 6.

Also, by continuing the operation of the conveyance drive member 33, the hold drive portion 36 that moves together with the circular conveyance drive member 33 at the periphery of the first drive wheel 31 separates from the front-side support shaft 12A of the substrate holder 11B together with the arc-shaped section of the conveyance drive member 33 and moves upward. The engagement between the hold drive portion 36 of the conveyance drive member 33 and the front-side support shaft 12A of the substrate holder 11B is released, and the substrate holder 11B stops at that position.

Then, as illustrated in FIG. 13, the conveyance robot 64 of the substrate carry-in and carry-out mechanism 6 is used to remove the substrate holder 11B from the substrate holder ejection portion 30C to the side of the substrate carry-in and carry-out mechanism 6, so that the substrate holder 11B is disposed together with the conveyance robot 64 on the support portion 62.

Subsequently, as illustrated in FIG. 14, the support portion 62 of the substrate carry-in and carry-out mechanism 6 is lifted, and the seal member 63 on the support portion 62 is tightly attached to the inner wall of the vacuum chamber 2 to separate the ambience inside the vacuum chamber 2 from the ambience inside the substrate carry-in and carry-out chamber 2A.

Then, as illustrated in FIG. 15, the lid portion 2a of the substrate carry-in and carry-out chamber 2A is opened, and a conveyance robot (not illustrated in the drawings) is used to remove the post-process substrate 10b from the substrate holder 11B to the outside air.

In this manner, each process performed on the pre-process substrate 10a is completed, and the post-process substrate 10b, on one process surface of which a predetermined processing has been performed (for example, a two-layer film is formed), can be used.

Advantageous effects other than the foregoing are not specifically described as the other advantageous effects are the same as those of the first example.

The present invention is not limited to the above-described embodiments, and various changes may be made to the present invention.

For example, in the above-described embodiments, the upper portion of the conveyance drive member 33 is configured to serve as the outward path-side conveyance portion 33a, and the lower portion of the conveyance drive member 33 is configured to serve as the return path-side conveyance portion 33c. However, the present invention is not limited to the foregoing structural elements, and these elements may serve as portions having reverse functions.

Also, it is possible to orient the substrate 10 vertically so as to form an annular conveyance path with respect to a horizontal plane.

Moreover, in the above-described embodiments, the substrate holders 11A and 11B that hold a plurality of the substrates 10 aligned in a single row in the longitudinal direction of the long-frame-shaped main body 110 are used as an example. However, the present invention is not limited to this example. For example, it is possible to configure that a plurality of the substrates 10 are held in a plurality of rows (two to three rows) in the longitudinal direction of the main body 110.

Also, in the above-described embodiments, the conveyance robot 64 that passes the substrate holder 11 is provided on the support portion 62 of the substrate carry-in and carry-out mechanism 6 that can move up and down. However, a conveyance robot that passes the substrate holder 11 may be provided near each of the substrate holder introduction portion 30A and the substrate holder ejection portion 30C of the substrate holder conveyance mechanism 3.

Also, in the above-described embodiments, a device that performs sputtering as the processing in a vacuum is described as an example. However, the present invention is not limited to this example. The present invention may be applied to a vacuum processing device that performs various types of processing (for example, plasma processing, ion implantation processing, vapor deposition processing, chemical vapor deposition processing, focused ion beam processing, etching processing, or the like).

In this case, a processing source that is used for performing different types of processing may be provided in the first and second processing regions 4 and 5.

In the above-described embodiments, processing performed on the substrate 10 once over the first and second processing regions 4 and 5 is described as an example. However, the present invention is not limited to this example. For example, it is possible to configure to perform processing multiple times by passing the substrate 10 through the first and second processing regions 4 and 5 multiple times.

Figure 23:
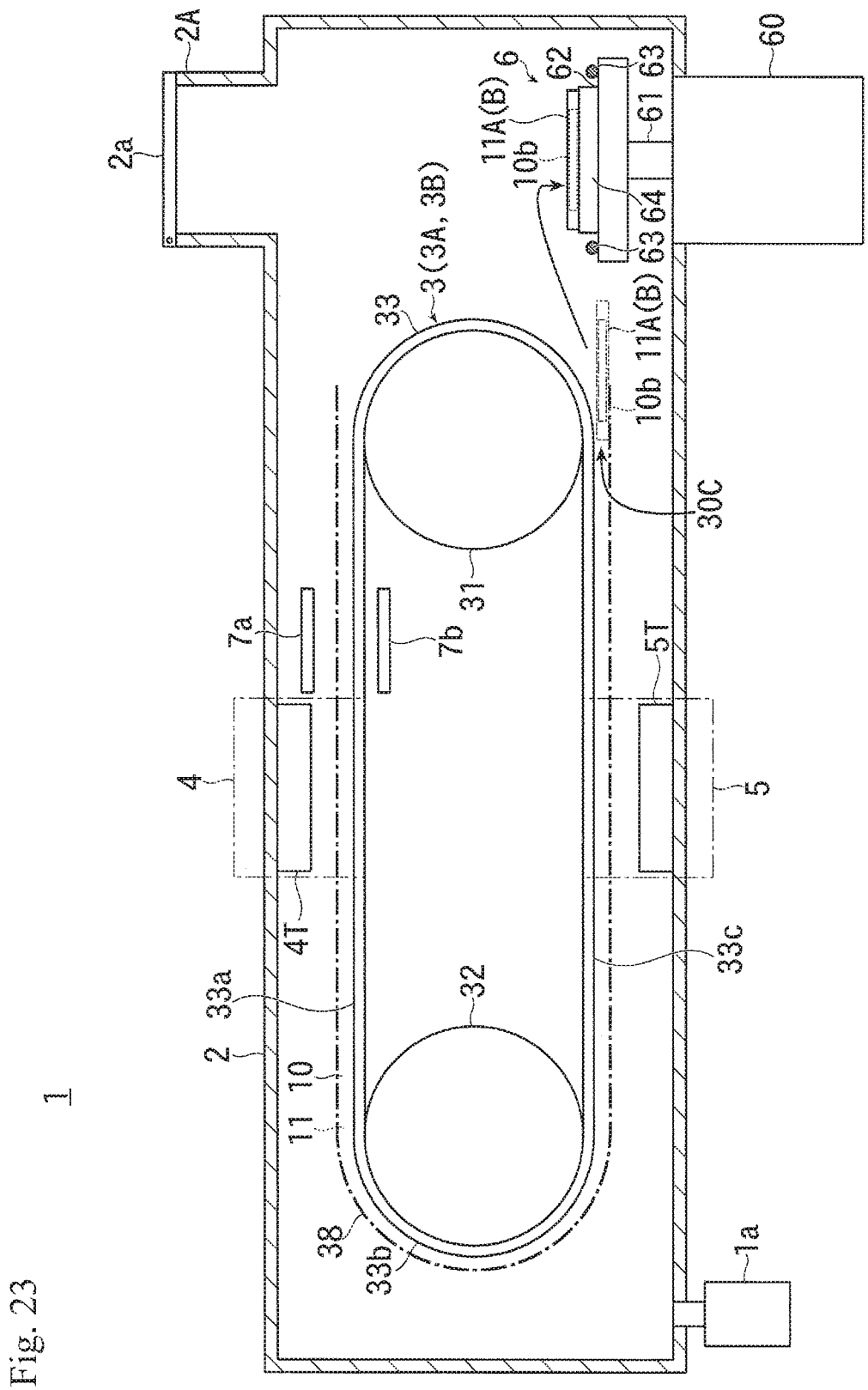
FIG. 23 is an explanatory view of an operation when processing is performed multiple times for a substrate (part 1).

In this case, as illustrated in, for example, FIG. 23, the support portion 62 of the substrate carry-in and carry-out mechanism 6 is disposed at the substrate holder removal position, and when using the conveyance robot 64, the substrate holder 11A(B) that holds the substrate having been subjected the first processing (i.e., the post-process substrate 10b) is removed from the substrate holder ejection portion 30C to the side of the substrate carry-in and carry-out mechanism 6 and is disposed on the support portion 62 together with the conveyance robot 64.

Figure 24:
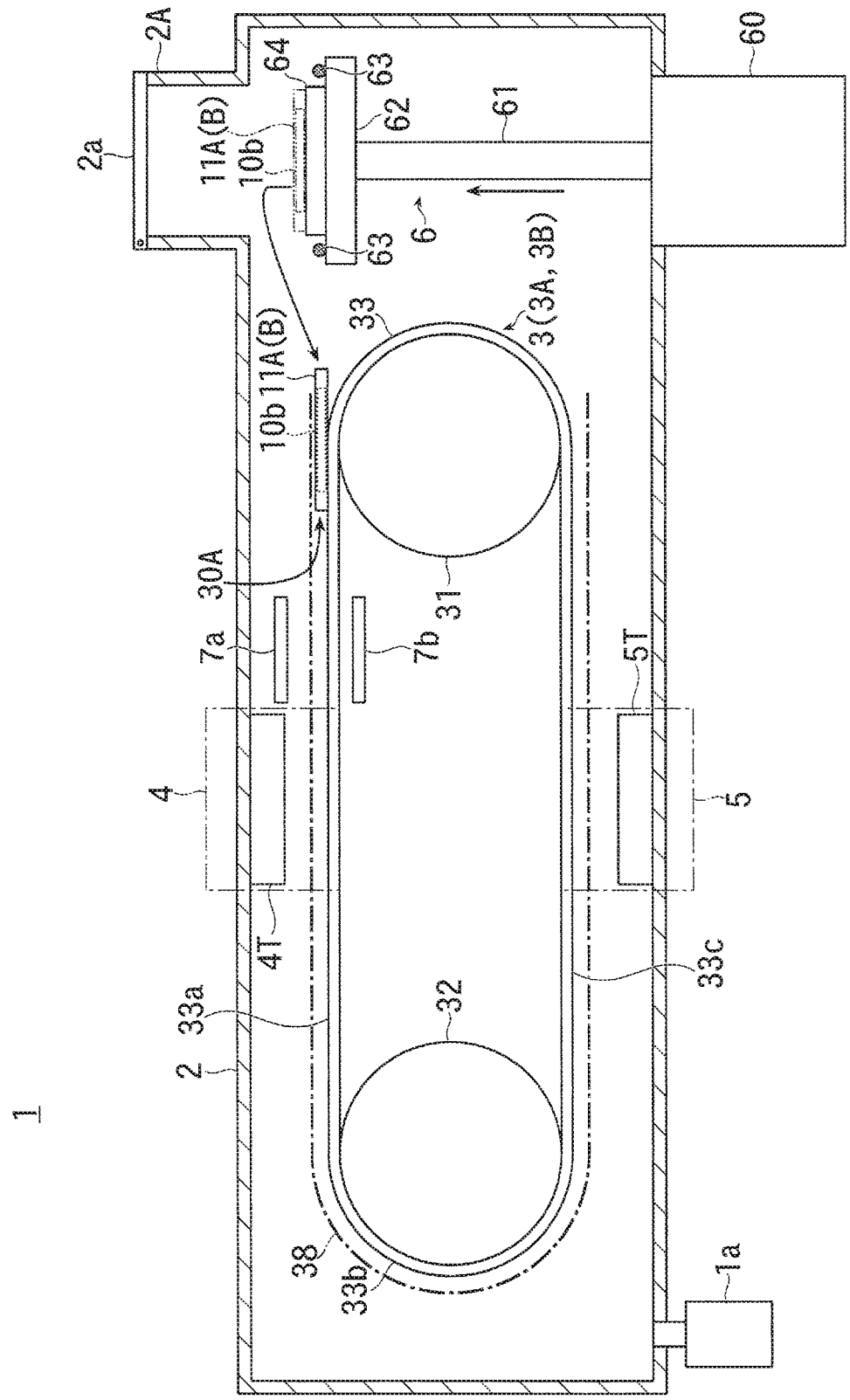
FIG. 24 is an explanatory view of the operation when processing is performed multiple times for a substrate (part 2).

Then, as illustrated in FIG. 24, the support portion 62 of the substrate carry-in and carry-out mechanism 6 is lifted to the substrate holder passing position and disposed so that the position of the substrate holder 11A(B) is as high as that of the outward path-side conveyance portion 33a of the conveyance drive member 33. Thereafter, the substrate holder 11A(B) is disposed on the substrate holder introduction portion 30A of the substrate holder conveyance mechanism 3 by the conveyance robot 64 on the support portion 62 of the substrate carry-in and carry-out mechanism 6.

Subsequently, the processing on the substrate 10b is performed for the second time by going through the aforementioned steps.

Also, the processing on the substrate 10b may be performed three or more times by going through the aforementioned operations and steps.

Figure 25:
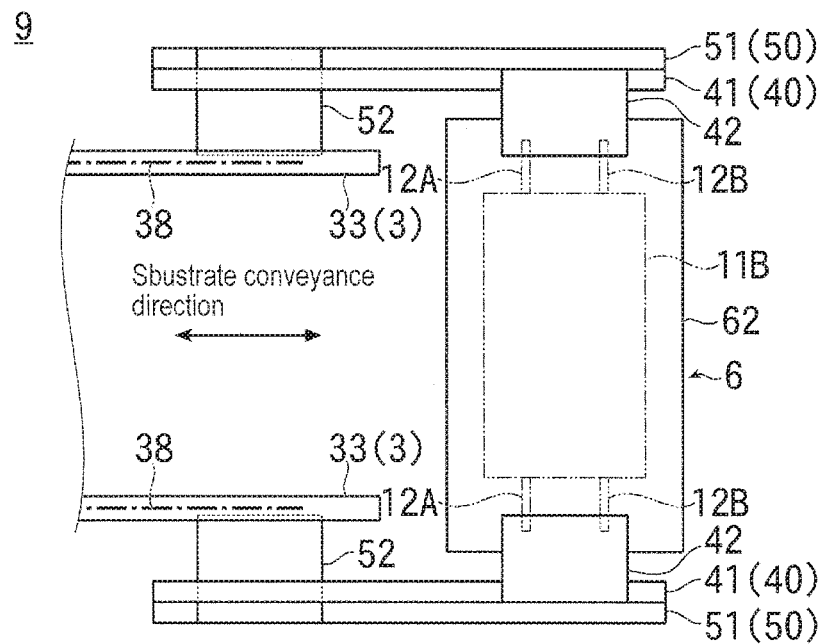
FIGS. 25(a) and 25(b) illustrate another embodiment of the conveyance robot used in the present invention.
Figure 25:
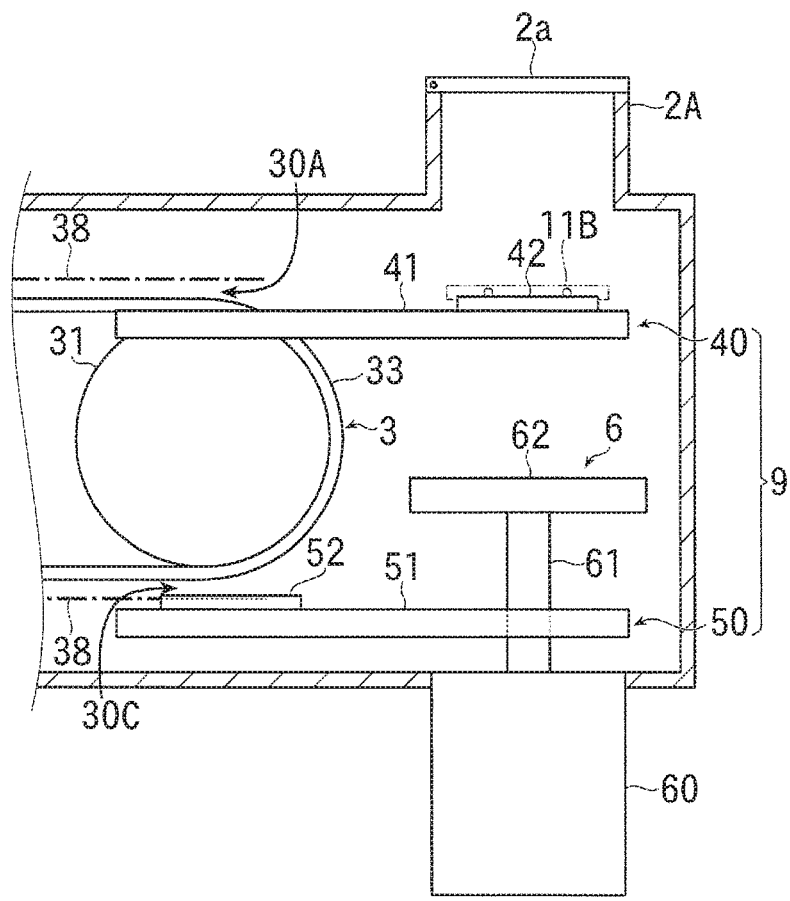

FIGS. 25(a) and 25(b) illustrate another example of the conveyance robot used in the present invention, where FIG. 25(a) is a plan view thereof, and FIG. 25(b) is a front view thereof.

As illustrated in FIGS. 25(a) and 25(b), the conveyance robot 9 of this example is provided near the substrate carry-in and carry-out mechanism 6 and the substrate holder conveyance mechanism 3. The conveyance robot 9 has: a substrate holder introduction mechanism 40, which is disposed at a position as high as that of the substrate holder introduction portion 30A above the substrate holder conveyance mechanism 3; and a substrate holder ejection mechanism 50, which is disposed at a position as high as that of the substrate holder ejection portion 30C below the substrate holder conveyance mechanism 3.

The substrate holder introduction mechanism 40 has a pair of introduction rails 41 that is provided in a horizontal straight line in parallel with the substrate conveyance direction so as to extend from both side portions of the support portion 62 of the substrate carry-in and carry-out mechanism 6 (both side end portions in the direction orthogonal to the substrate conveyance direction) to both side portions of the substrate holder introduction portion 30A of the substrate holder conveyance mechanism 3 (both side end portions in the direction orthogonal to the substrate conveyance direction).

Each introduction rail 41 of the substrate holder introduction mechanism 40 is provided with an introduction support member 42 that is movable along each introduction rail 41 between the aforementioned substrate holder passing position of the support portion 62 of the substrate carry-in and carry-out mechanism 6 and the substrate holder introduction portion 30A of the substrate holder conveyance mechanism 3.

These introduction support members 42 are formed as, for example, flat plates and arranged, for example, as a pair in parallel with a horizontal plane.

Also, a configuration is provided such that, for example, the front-side support shaft 12A and the rear-side support shaft 12B of the substrate holder 11B are supported from the sides of both side portions and conveyed by the pair of introduction support members 42.

The pair of the introduction support members 42 of this example is configured so that the interval therebetween is longer than the length in the direction orthogonal to the substrate conveyance direction of the support portion 62 of the substrate carry-in and carry-out mechanism 6 so as to enable evacuation from the lifting path of the support portion 62. The foregoing is made possible by, for example, moving the introduction support members 42 in the direction orthogonal to the substrate conveyance direction and separating the introduction support members 42 from each other.

Meanwhile, the substrate holder ejection mechanism 50 has a pair of ejection rails 51 that is provided in a horizontal straight line in parallel with the substrate conveyance direction so as to extend from both side portions of the support portion 62 of the substrate carry-in and carry-out mechanism 6 (both side end portions in the direction orthogonal to the substrate conveyance direction) to both side portions of the substrate holder ejection portion 30C of the substrate holder conveyance mechanism 3 (both side end portions in the direction orthogonal to the substrate conveyance direction).

Each ejection rail 51 of the substrate holder ejection mechanism 50 is provided with an ejection support member 52 that is movable along each ejection rail 51 between the aforementioned substrate holder removal position of the support portion 62 of the substrate carry-in and carry-out mechanism 6 and the substrate holder ejection portion 30C of the substrate holder conveyance mechanism 3.

The configuration of these ejection support members 52 is identical to that of the aforementioned introduction support members 42 of the substrate holder introduction mechanism 40.

Specifically, the ejection support member 52 is formed as, for example, a flat plate and arranged as, for example, a pair in parallel with a horizontal plane.

Also, a configuration is provided such that, for example, the front-side support shaft 12A and the rear-side support shaft 12B of the substrate holder 11B, which are used in the substrate holder conveyance mechanism 3B of the aforementioned second example, are supported from the sides of both side portions and conveyed by the pair of ejection support members 52.

Also, as in the case of the aforementioned introduction support members 42, the pair of the ejection support members 52 of this example is configured so that the interval therebetween is longer than the length in the direction orthogonal to the substrate conveyance direction of the support portion 62 of the substrate carry-in and carry-out mechanism 6 so as to enable evacuation from the lifting path of the support portion 62. The foregoing is made possible by, for example, moving the ejection support members 52 in the direction orthogonal to the substrate conveyance direction and separating the ejection support members 52 from each other.

Also, although not illustrated in the drawings, at the upper edge portion of the support portion 62 of the substrate carry-in and carry-out mechanism 6, a seal member (for example, an O-ring, or the like), which is directed to the separation of the ambience inside the substrate carry-in and carry-out chamber 2A and that of the inside of the vacuum chamber 2 when carrying in and carrying out the substrate 10.

Figure 26:
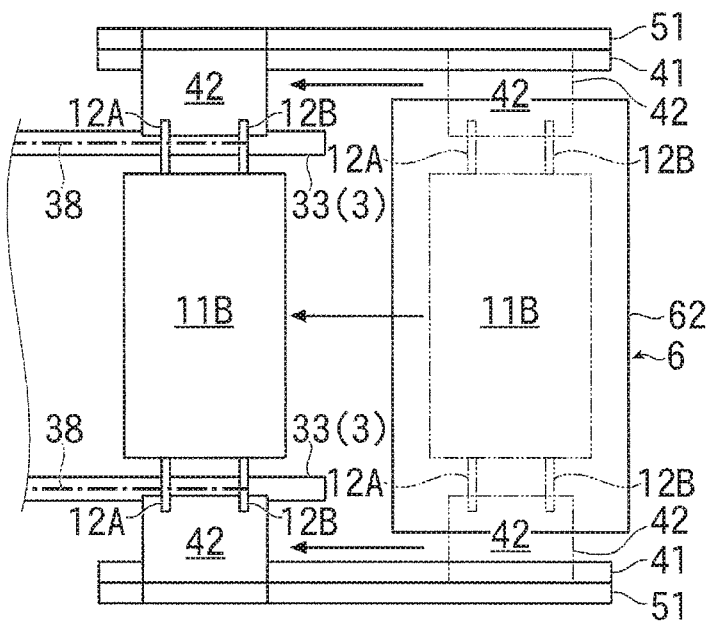
FIGS. 26(a) and 26(b) are explanatory views illustrating a passing operation of a substrate holder using the conveyance robot of this example.
Figure 26:
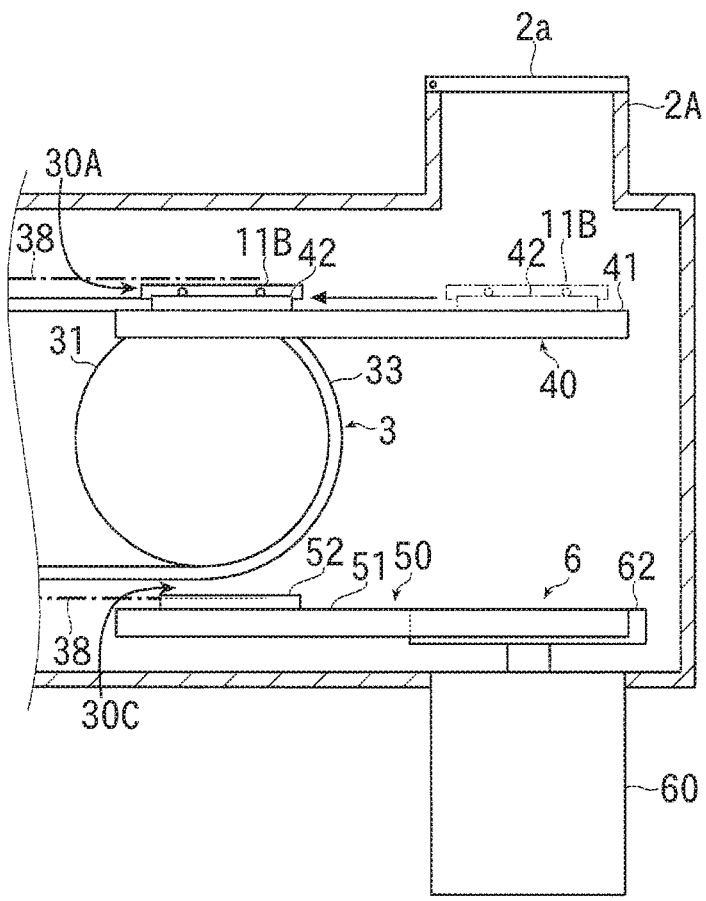

FIGS. 26(a) and 26(b) are explanatory views illustrating passing operation of a substrate holder using the conveyance robot of this example. FIG. 26(a) is a plan view of a substrate holder introduction mechanism of the conveyance robot. FIG. 26(b) is a front view of the conveyance robot.

In this example, when a substrate holder (for example, the substrate holder 11B) that already holds the substrate 10 in the substrate carry-in and carry-out chamber 2A is introduced in the conveyance path of the substrate holder conveyance mechanism 3, the support portion 62 of the substrate carry-in and carry-out mechanism 6 that supports the substrate holder 11B is lowered to the aforementioned substrate holder passing position.

During this operation, to avoid contact between the introduction support member 42 of the substrate holder introduction mechanism 40 and the support portion 62 of the substrate carry-in and carry-out mechanism 6, the introduction support members 42 of the substrate holder introduction mechanism 40 are evacuated in advance from the lifting path of the support portion 62 of the substrate carry-in and carry-out mechanism 6.

Also, at this substrate holder passing position, the substrate holder 11B supported on the support portion 62 of the substrate carry-in and carry-out mechanism 6 is passed to and supported by the introduction support members 42 of the substrate holder introduction mechanism 40.

In this case, for example, the introduction support members 42 of the substrate holder introduction mechanism 40, each of which has been evacuated from the lifting path of the support portion 62 of the substrate carry-in and carry-out mechanism 6, are moved closer to each other. In this manner, these introduction support members 42 are inserted into a gap surrounded by the surface of the support portion 62 of the substrate carry-in and carry-out mechanism 6 and the front-side support shaft 12A and the rear-side support shaft 12B of the substrate holder 11B supported on the support portion 62, and the support portion 62 of the substrate carry-in and carry-out mechanism 6 is lowered. Thus, as illustrated in FIG. 26(a), the front-side support shaft 12A and the rear-side support shaft 12B of the substrate holder 11B are supported from the sides of both side portions by the introduction support members 42 of the substrate holder introduction mechanism 40.

Subsequently, as illustrated in FIG. 26(b), the support portion 62 of the substrate carry-in and carry-out mechanism 6 is lowered to the substrate holder removal position.

Also, under this condition, the introduction support members 42 of the substrate holder introduction mechanism 40 are moved toward the side of the substrate holder conveyance mechanism 3 along the introduction rails 41, and the substrate holder 11B supported on the introduction support members 42 is disposed on the substrate holder introduction portion 30A of the substrate holder conveyance mechanism 3.

Subsequently, as described above, by operating the conveyance drive member 33 of the substrate holder conveyance mechanism 3, the substrate holder 11B is conveyed toward the first processing region 4, and predetermined processing is performed in sequence.

During the aforementioned operation, the ejection support members 52 of the substrate holder ejection mechanism 50 are, for example, disposed at the position of the substrate holder ejection portion 30C of the substrate holder conveyance mechanism 3.

Figure 27:
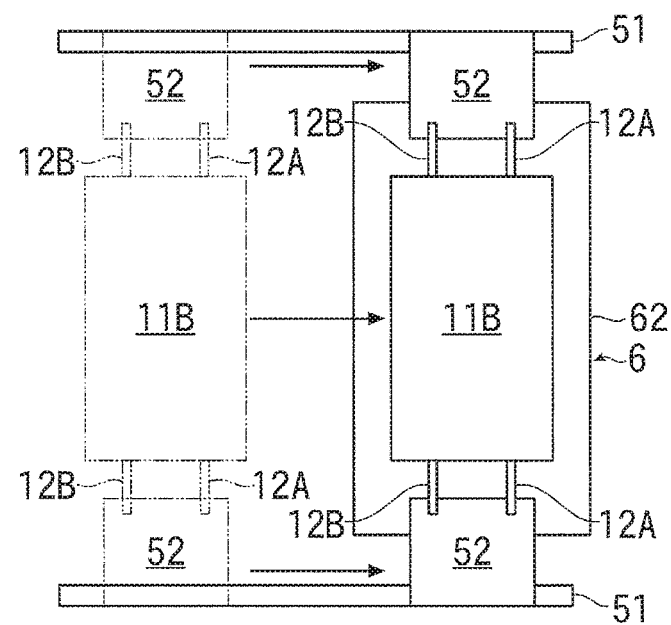
FIGS. 27(a) and 27(b) are explanatory views illustrating an ejection operation of a substrate holder using the conveyance robot of this example.
Figure 27:
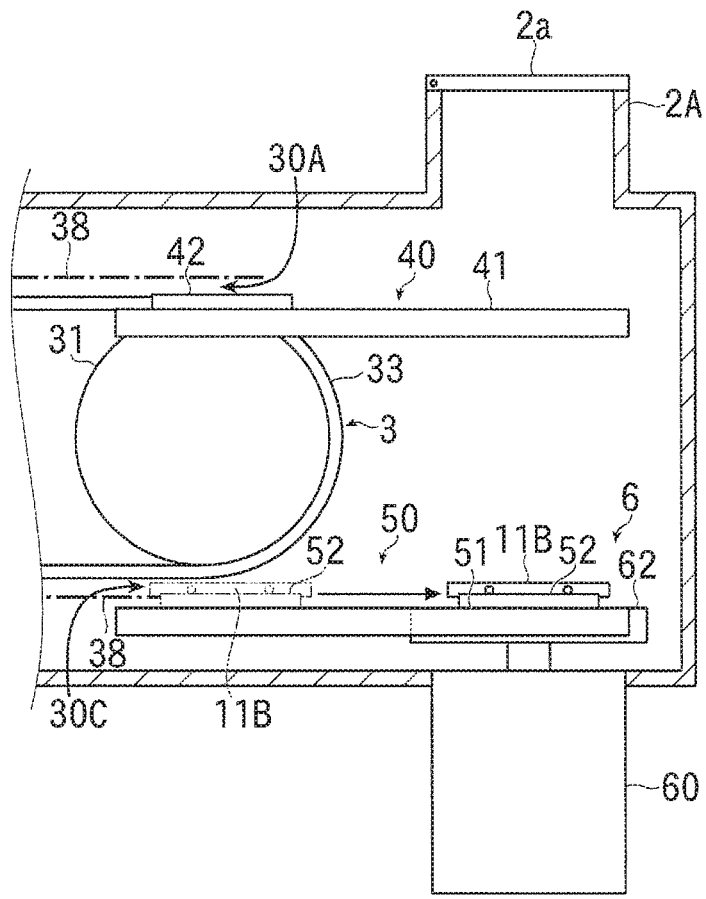

FIGS. 27(a) and 27(b) are explanatory views illustrating the ejection operation of a substrate holder by using the conveyance robot of this example. FIG. 27(a) is a plan view of a substrate holder ejection mechanism of the conveyance robot. FIG. 27(b) is a front view of the conveyance robot.

In this example, when the aforementioned substrate holder 11B is ejected from the conveyance path, as illustrated in FIGS. 27(a) and 27(b), the ejection support members 52 of the substrate holder ejection mechanism 50 are disposed on the substrate holder ejection portion 30C of the substrate holder conveyance mechanism 3. Also, the support portion 62 of the substrate carry-in and carry-out mechanism 6 is lowered to the aforementioned substrate holder removal position.

Also, the substrate holder 11B, which has been conveyed upon completion of predetermined processing, is passed to and supported by the ejection support members 52 of the substrate holder ejection mechanism 50 at the substrate holder ejection portion 30C of the substrate holder conveyance mechanism 3.

In this case, as illustrated in FIG. 27(a), the dimensions of each member, the conveyance speed, and other conditions are set in advance so that the front-side support shafts 12A and the rear-side support shafts 12B of the substrate holder 11B are smoothly supported by the ejection support members 52 of the substrate holder ejection mechanism 50 from the sides of both side portions thereof.

Also, under this condition, the ejection support members 52 of the substrate holder ejection mechanism 50 are moved toward the side of the substrate carry-in and carry-out mechanism 6 along the ejection rails 51, and the substrate holder 11B is disposed slightly above the support portion 62 of the substrate carry-in and carry-out mechanism 6 disposed at the substrate holder removal position (see FIGS. 27(a) and 27(b)).

In addition, the ejection support members 52 of the substrate holder ejection mechanism 50 are moved to the direction in which the aforementioned members are separated from each other. Consequently, the ejection support members 52 are evacuated from the lifting path of the support portion 62 of the substrate carry-in and carry-out mechanism 6, and support for the front-side support shafts 12A and the rear-side support shafts 12B of the substrate holder 11B is canceled. Also, by slightly lifting the support portion 62, the substrate holder 11B is mounted on the support portion 62 of the substrate carry-in and carry-out mechanism 6.

Subsequently, after disposing the substrate holder 11B in the substrate carry-in and carry-out chamber 2A, the ambience of which is separated, as described above, by lifting the support portion 62 of the substrate carry-in and carry-out mechanism 6, the lid portion 2a of the substrate carry-in and carry-out chamber 2A is opened. Then, a conveyance robot (not illustrated in the drawings) is used to remove a post-process substrate (not shown in the drawings) from the substrate holder 11B to the outside air (see FIGS. 14 and 15).

During the aforementioned operation, the introduction support members 42 of the substrate holder introduction mechanism 40 are, for example, disposed at the position of the substrate holder introduction portion 30A of the substrate holder conveyance mechanism 3.

When processing is performed multiple times for the substrate 10 held in the substrate holder 11B, the support portion 62 of the substrate carry-in and carry-out mechanism 6 is lifted and disposed at the substrate holder passing position. Consequently, the operation explained with reference to in FIGS. 26(a) and 26(b) is performed, and the substrate holder 11 is passed to and held by the introduction support members 42 of the substrate holder introduction mechanism 40. Further, the introduction support members 42 are operated to introduce the substrate holder 11B into the conveyance path of the substrate holder conveyance mechanism 3.

Advantages in the use of the aforementioned conveyance robot 9 of this example include the following:

Specifically, the substrate holder introduction mechanism 40 and the substrate holder ejection mechanism 50 that constitute the conveyance robot 9 of this example causes the support members that support the substrate holder 11B (the introduction support members 42 or the ejection support members 52) to move straight along the rails (the introduction rails 41 or the ejection rails 51). Thus, the aforementioned mechanisms 40 and 50 are configured to convey the substrate holder 11B between the substrate holder conveyance mechanism 3 and the support portion 62 of the substrate carry-in and carry-out mechanism 6. Accordingly, the aforementioned mechanisms 40 and 50 are configured differently from the substrate carry-in and carry-out mechanism 6, in which the conveyance robot 64 that conveys the substrate holder 11A (11B) is provided on the support portion 62 capable of vertical movement.

Since the conveyance robot 9 of this example has the aforementioned configuration, a drive source and drive mechanism that drive the support member of the substrate holder 11B can be fixed and disposed on the side of the outside air. In addition, the use of a drive member (such as, a shaft) is not necessary. One advantageous effect produced by the conveyance robot 9 is in the ease of design of the drive portion in the vacuum chamber 2 without having to develop a special design therefor.

Also, by virtue of the conveyance robot 9 of this example, the substrate holder introduction mechanism 40 and the substrate holder ejection mechanism 50 may be moved independently from the vertical movement of the support portion 62 of the substrate carry-in and carry-out mechanism 6. The operation of the support portion 62 of the substrate carry-in and carry-out mechanism 6 to carry the substrate holder 11B to the inside the vacuum chamber 2 and to carry the substrate holder 11B to the outside the vacuum 2, the operation to pass the substrate holder 11B from the support portion 62 of the substrate carry-in and carry-out mechanism 6 to the substrate holder introduction portion 30A of the substrate holder conveyance mechanism 3, and the operation to remove the substrate holder 11B from the substrate holder ejection portion 30C of the substrate holder conveyance mechanism 3 to the support portion 62 of the substrate carry-in and carry-out mechanism 6 can be performed at an optimum timing so as to decrease the wait time to a minimum. Accordingly, the time for vacuum processing can be reduced.

REFERENCE SIGNS LIST 1 vacuum processing device
2 vacuum chamber
2A substrate carry-in and carry-out chamber
3 substrate holder conveyance mechanism
3A substrate holder conveyance mechanism of first example
3B substrate holder conveyance mechanism of second example
4 first processing region (processing region)
5 second processing region (processing region)
6 substrate carry-in and carry-out mechanism
7a, 7b heating and cooling mechanism
8 frame structure body
9 conveyance robot
10 substrate
10a pre-process substrate
10b post-process substrate
11, 11A, 11B substrate holder
12 support shaft
12A front-side support shaft
12B rear-side support shaft
30A substrate holder introduction portion
30B conveyance turning portion
30C substrate holder ejection portion
33 conveyance drive member
33a outward path-side conveyance portion
33b turning portion
33c return path-side conveyance portion
36 hold drive portion
37 holding recess portion
38 guide member
39 auxiliary support portion
40 substrate holder introduction mechanism
41 introduction rail
41 introduction support member
50 substrate holder ejection mechanism
51 ejection rail
52 ejection support member
62 support portion (substrate holder support portion)
63 seal member
64 conveyance robot

What is claimed is:

1. A vacuum processing device, comprising:
a vacuum chamber in which a single vacuum ambience is formed;
a processing region provided in the vacuum chamber, the processing region having a processing source that performs processing on a planar process surface of a substrate;
a conveyance path provided in the vacuum chamber, the conveyance path conveying the substrate so as to pass through the processing region; and
a substrate holder conveyance mechanism configured to convey a substrate holder along the conveyance path, wherein the substrate holder holds and aligns a plurality of substrates in an orthogonal conveyance direction orthogonal to a conveyance direction of the substrates, wherein:
the conveyance path is formed as a single annular path when the conveyance path is projected onto a plane containing: a normal line of an arbitrary point on a process surface of the substrate conveyed through the conveyance path, and a trajectory line drawn by the arbitrary point on the process surface of the substrate when the substrate passes straight through the processing region,
the substrate holder conveyance mechanism is provided with a substrate holder introduction portion for passing, to the substrate holder conveyance mechanism, the substrate holder that holds a pre-process substrate, and is further provided with a substrate holder ejection portion for removing, from the substrate holder conveyance mechanism, the substrate holder that holds a post-process substrate,
at both end portions in the orthogonal conveyance direction, the substrate holder has a support shaft extending in the orthogonal conveyance direction, and in the substrate holder conveyance mechanism, the substrate holder is configured such that the support shaft thereof is rotatably and removably held to a hold drive portion around a rotation axis line, as its center, running in the orthogonal conveyance direction, wherein the hold drive portion is provided to a drive member constituting the conveyance path, and
the hold drive portion is provided outside the drive member, a guide member for abutting with the support shaft and for preventing the substrate holder from falling from the drive member is provided, and the guide member is configured such that the substrate holder is held by the hold drive portion at the substrate holder introduction portion of the substrate holder conveyance mechanism, and the substrate holder is released from the hold drive portion at the substrate holder ejection portion of the substrate holder conveyance mechanism.

2. The vacuum processing device according to claim 1, wherein the substrate holder conveyance mechanism has the processing region on each of an outward path and a return path of the conveyance path.

3. The vacuum processing device according to claim 2, wherein the substrate holder conveyance mechanism has a conveying and turning portion for conveying the substrate holder by turning from the outward path to the return path of the conveyance path, and the conveying and turning portion is configured to convey the substrate holder without reversing front and rear sides of the substrate holder in the conveyance direction.

4. The vacuum processing device according to claim 2, wherein the substrate holder conveyance mechanism has a conveying and turning portion for conveying the substrate holder by turning from the outward path to the return path of the conveyance path, and the conveying and turning portion is configured to convey the substrate holder by reversing the front and rear sides of the substrate holder in the conveyance direction.

5. The vacuum processing device according to claim 1, wherein the substrate holder conveyance mechanism has a heating mechanism for heating the substrate holder that holds the substrate prior to processing.

6. The vacuum processing device according to claim 1, wherein the substrate holder conveyance mechanism is integrally assembled to a frame structure body that can be removably attached to the vacuum chamber.

7. The vacuum processing device according to claim 1, further comprising: a substrate carry-in and carry-out chamber configured such that an ambience thereof is communicable with or separable from an ambience of the vacuum chamber, the substrate carry-in and carry-out chamber enabling the substrate to be carried into and out of the vacuum chamber; and a substrate carry-in and carry-out mechanism and a conveyance robot in the vacuum chamber,
wherein the substrate carry-in and carry-out mechanism carries a substrate holder that holds a pre-process substrate from inside the substrate carry-in and carry-out chamber to the vacuum chamber and carries a substrate holder that holds a post-process substrate into the substrate carry-in and carry-out chamber, and the conveyance robot passes the substrate holder that holds the pre-process substrate from the substrate carry-in and carry-out mechanism to the substrate holder introduction portion of the substrate holder conveyance mechanism and removes the substrate holder that holds the post-process substrate from the substrate holder ejection portion of the substrate holder conveyance mechanism in order to pass the substrate holder to the substrate carry-in and carry-out mechanism.

8. The vacuum processing device according to claim 7, wherein the substrate carry-in and carry-out mechanism has a substrate holder support portion that moves between: (i) a substrate holder passing position, where the substrate holder that holds a pre-process substrate is passed to the substrate holder introduction portion of the substrate holder conveyance mechanism, and (ii) a substrate holder removal position, where the substrate holder that holds a post-process substrate is removed from the substrate holder ejection portion of the substrate holder conveyance mechanism, and wherein the conveyance robot is disposed on the substrate holder support portion.

9. The vacuum processing device according to claim 7, wherein the substrate holder support portion of the substrate carry-in and carry-out mechanism is configured to be movable to a position where the vacuum chamber and the substrate carry-in and carry-out chamber communicate with each other, and to be moved to the communication position, where the substrate holder support portion blocks a communication channel between the vacuum chamber and the substrate carry-in and carry-out chamber in order to thereby separate the ambience of the substrate carry-in and carry-out chamber from the ambience of the vacuum chamber.

10. The vacuum processing device according to claim 9, wherein a distance between the position where the vacuum chamber and the substrate carry-in and carry-out chamber communicate with each other and the substrate holder passing position is shorter than a distance between the position where the vacuum chamber and the substrate carry-in and carry-out chamber communicate with each other and the substrate holder removal position.

11. The vacuum processing device according to claim 1, wherein the conveyance path projected onto a vertical plane is formed to be annular.

\* \* \* \* \*